(12) United States Patent
Kishida

(10) Patent No.: US 11,358,802 B2
(45) Date of Patent: Jun. 14, 2022

(54) PALLET CONVEYING APPARATUS, COMPONENT MOUNTER, PALLET CONVEYING METHOD

(71) Applicant: YAMAHA HATSUDOKI KABUSHIKI KAISHA, Iwata (JP)

(72) Inventor: Akira Kishida, Iwata (JP)

(73) Assignee: YAMAHA HATSUDOKI KABUSHIKI KAISHA, Iwata (JP)

(*) Notice: Subject to any disclaimer, the term of this patent is extended or adjusted under 35 U.S.C. 154(b) by 0 days.

(21) Appl. No.: 17/311,937

(22) PCT Filed: Feb. 1, 2019

(86) PCT No.: PCT/JP2019/003585
§ 371 (c)(1),
(2) Date: Jun. 8, 2021

(87) PCT Pub. No.: WO2020/157952
PCT Pub. Date: Aug. 6, 2020

(65) Prior Publication Data
US 2022/0024694 A1 Jan. 27, 2022

(51) Int. Cl.
*B65G 29/00* (2006.01)
*H05K 13/02* (2006.01)
(Continued)

(52) U.S. Cl.
CPC .............. *B65G 29/00* (2013.01); *B23Q 7/02* (2013.01); *B65G 47/80* (2013.01); *H05K 13/02* (2013.01);
(Continued)

(58) Field of Classification Search
CPC ........ B23Q 7/02; B23Q 1/0018; B23Q 7/005; H05K 13/02; B65G 29/00;
(Continued)

(56) References Cited

U.S. PATENT DOCUMENTS 3,343,645 A * 9/1967 Doerfling .............. B65G 29/00
269/57
3,901,166 A * 8/1975 Morandi .............. B65G 47/252
198/411
(Continued)

FOREIGN PATENT DOCUMENTS

CN 206825070 * 4/2016 ............... B23Q 7/00
CN 113120627 * 7/2021 ............. B65G 61/00
(Continued)

OTHER PUBLICATIONS

International Search Report issued in PCT/JP2019/003585; dated Apr. 16, 2019.

*Primary Examiner* — James R Bidwell
(74) *Attorney, Agent, or Firm* — Studebaker & Brackett PC

(57) ABSTRACT

The turntable turnable about the table turning axis and the turning hooks mounted on the turntable turnably about the hook turning axes separated from the table turning axis are provided. By transmitting the turning of the turntable to the turning hooks, the pallet is conveyed by the engaging rollers provided on the turning hooks. Particularly, the turning hooks displace the engaging rollers in the pull-out direction by turning about the hook turning axes with respect to the turntable in the direction opposite to the turning direction of the turntable while turning about the table turning axis together with the turntable. Thus, the engaging rollers move along paths relatively close to straight lines. In this way, the pallet can be conveyed while the engaging rollers engaged with the pallet are moved along the paths close to the straight lines.

20 Claims, 12 Drawing Sheets

(51) Int. Cl.
  *B23Q 7/02* (2006.01)
  *B65G 47/80* (2006.01)
  *B65G 35/06* (2006.01)

(52) U.S. Cl.
  CPC ...... *B65G 35/06* (2013.01); *B65G 2201/0267* (2013.01)

(58) Field of Classification Search
  CPC  B65G 2201/0267; B65G 47/80; B65G 35/06; B65G 35/00
  USPC .............................. 198/469.1, 465.1, 465.2
  See application file for complete search history.

(56) References Cited

U.S. PATENT DOCUMENTS

| | | | | |
|---|---|---|---|---|
| 5,205,026 A | * | 4/1993 | Sticht | B23P 21/004 29/33 P |
| 7,219,793 B2 | * | 5/2007 | Robertsson | B65G 17/002 188/336 |
| 2004/0134755 A1 | * | 7/2004 | Sticht | B65G 43/10 198/465.2 |
| 2005/0247546 A1 | * | 11/2005 | Strange | B23Q 7/1447 198/465.2 |
| 2018/0332749 A1 | * | 11/2018 | Matsuyama | H05K 13/02 |
| 2022/0024694 A1 | * | 1/2022 | Kishida | B65G 29/00 |

FOREIGN PATENT DOCUMENTS

| | | | | |
|---|---|---|---|---|
| DE | 10 2017 123 853 | * | 2/2019 | ............. B65G 49/00 |
| JP | 3884278 B2 | | 2/2007 | |
| JP | 4706563 B2 | | 6/2011 | |
| JP | 6230609 B2 | | 11/2017 | |
| KR | 10-2022-0023719 | * | 8/2020 | ............. B23Q 7/14 |
| WO | 2020/157952 | * | 8/2020 | ............. H05K 13/02 |

* cited by examiner

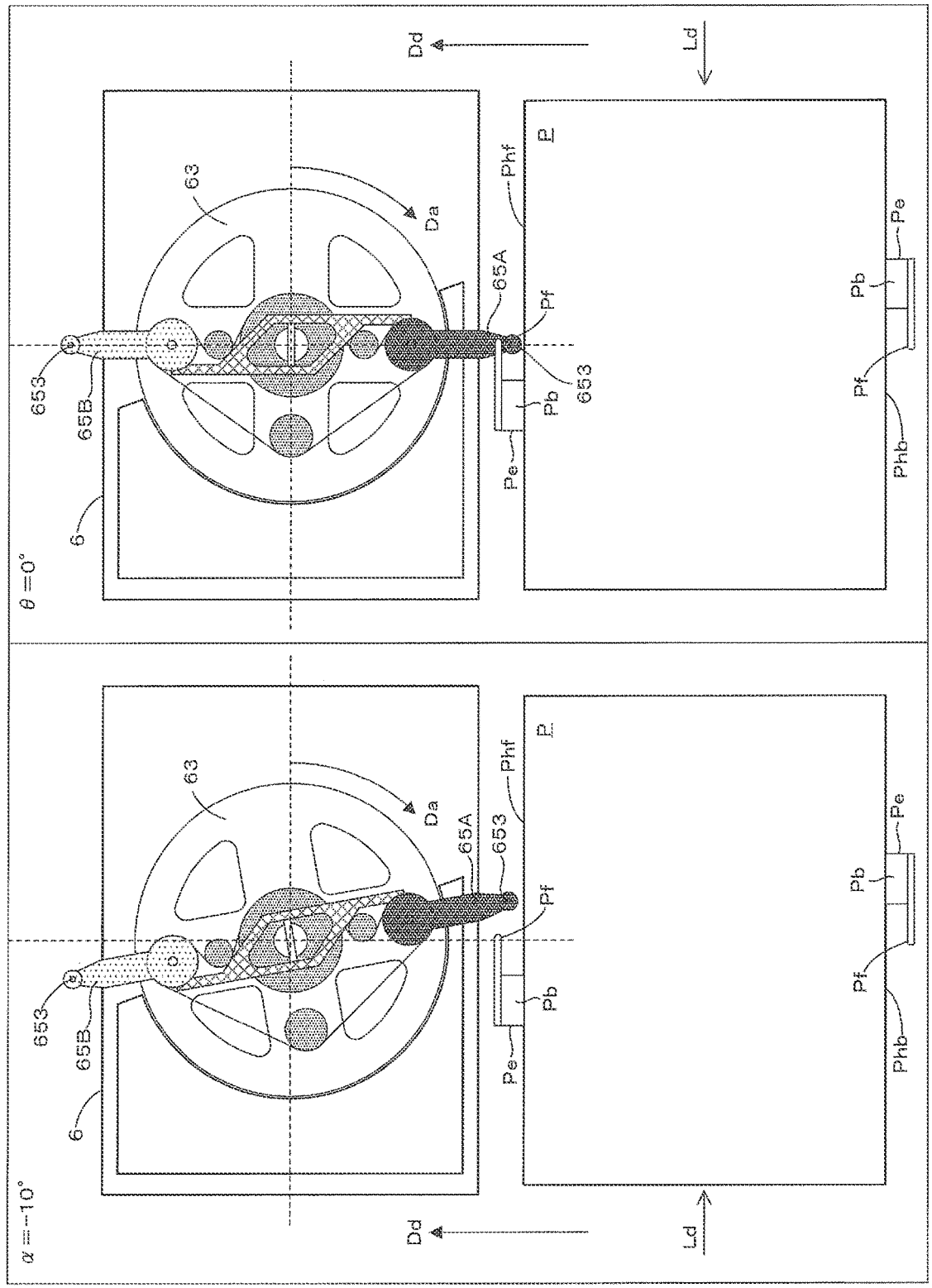

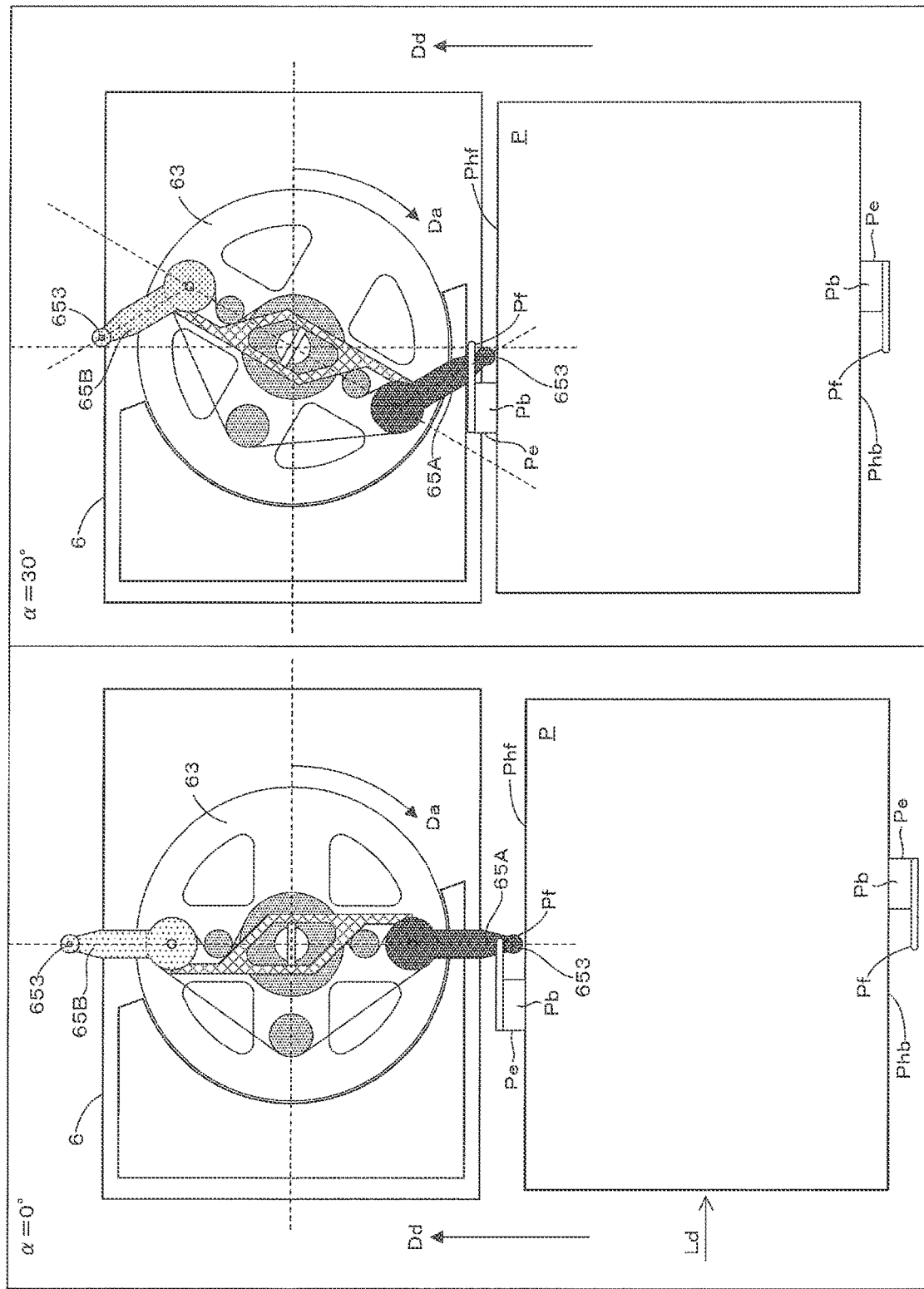

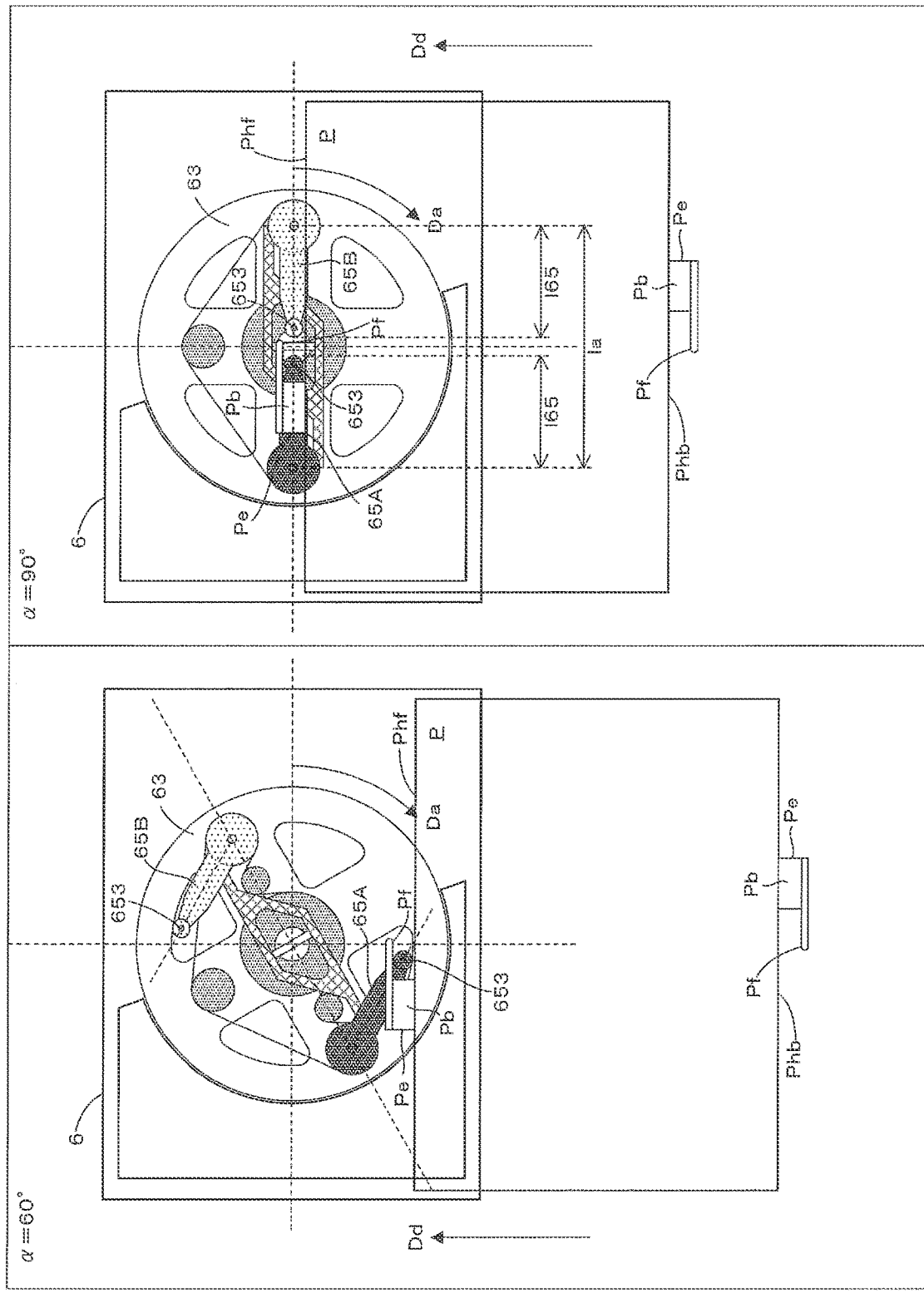

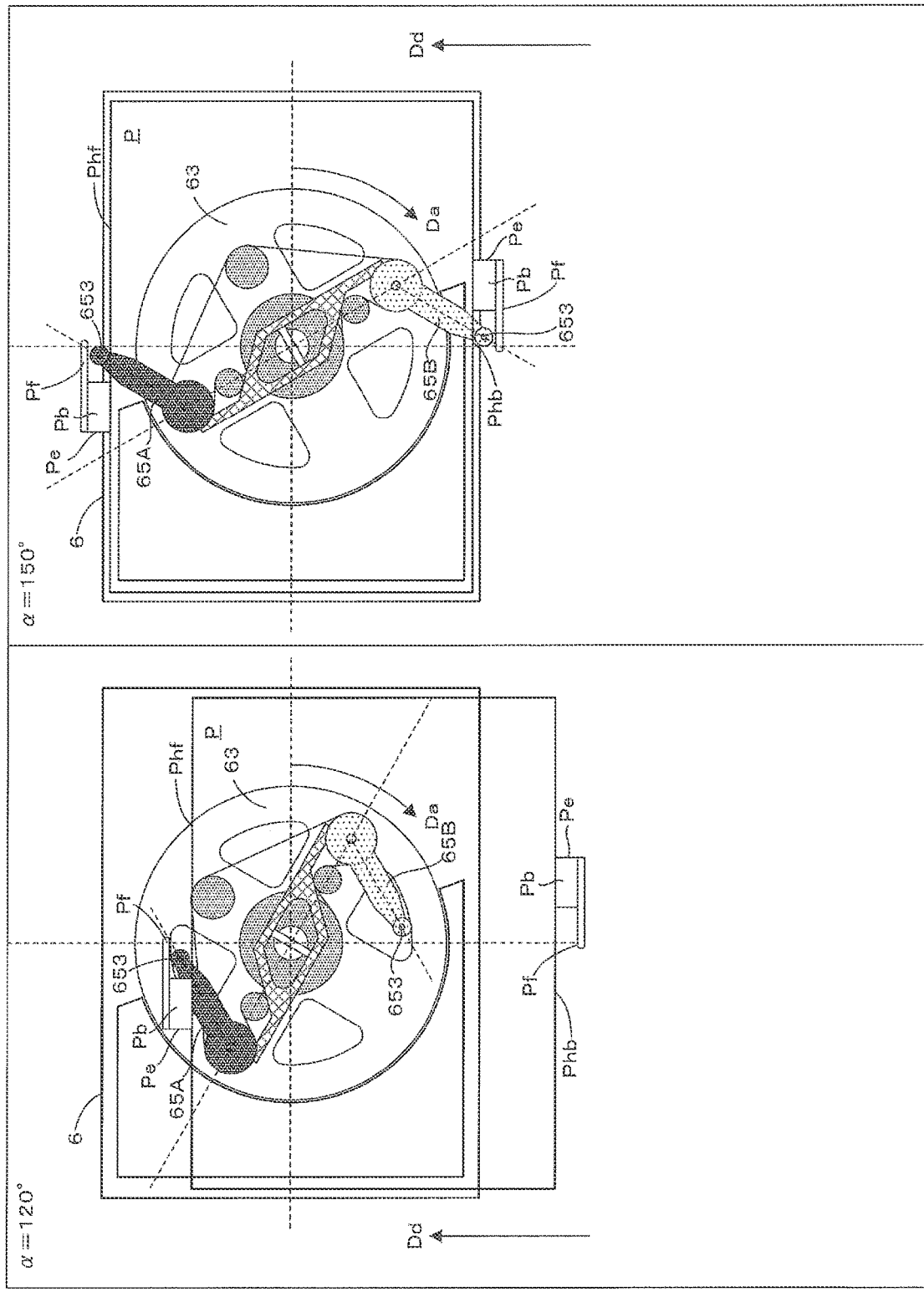

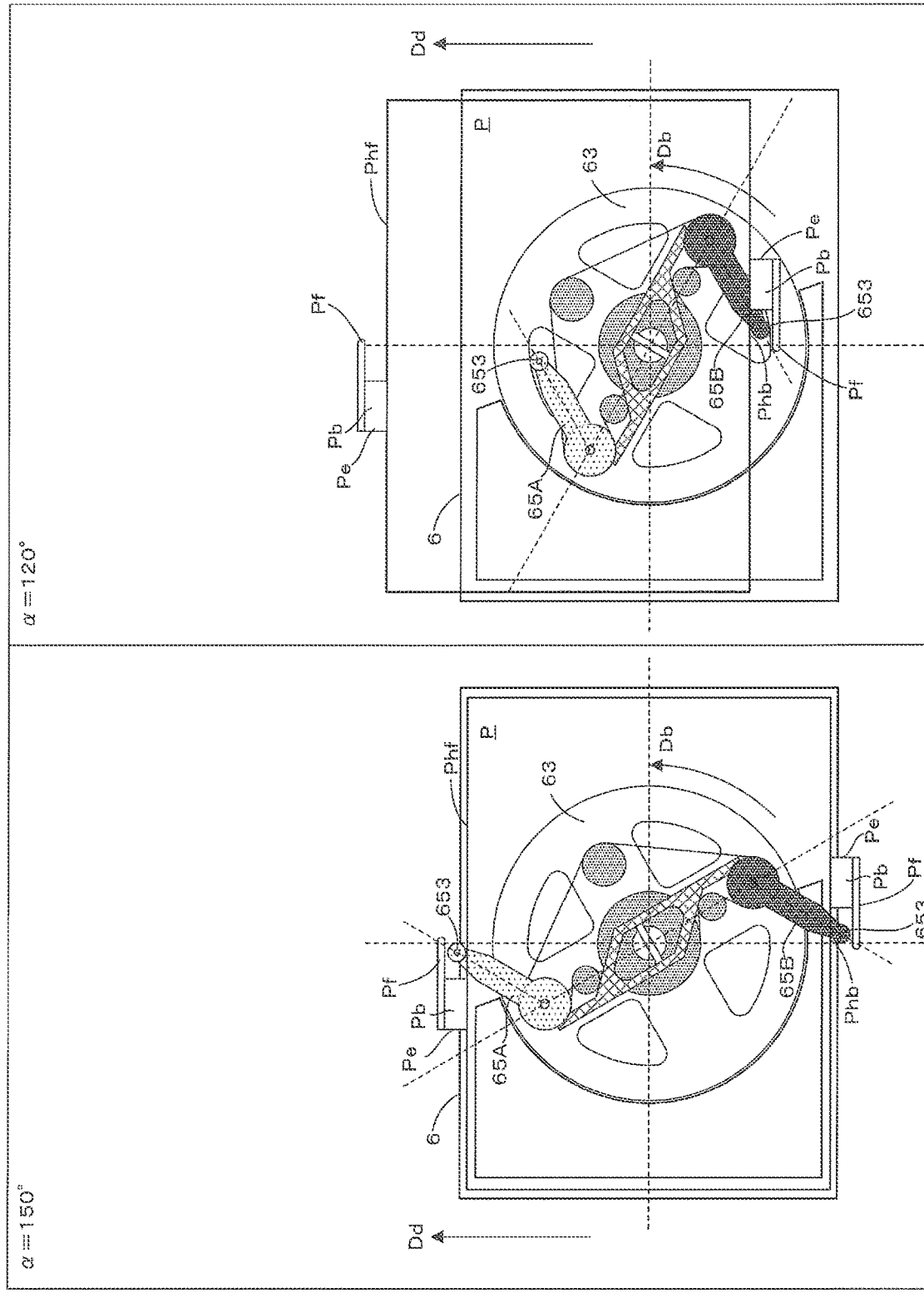

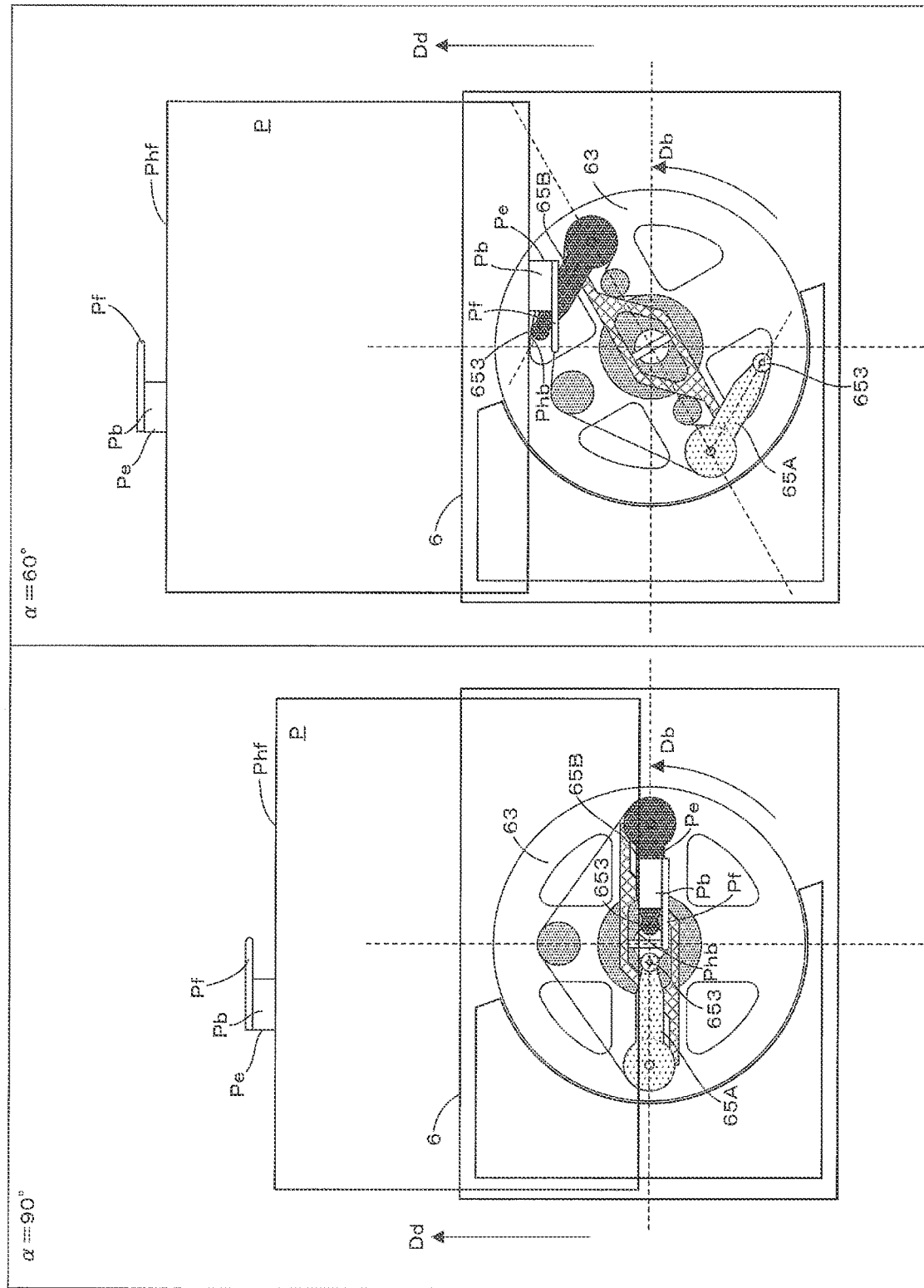

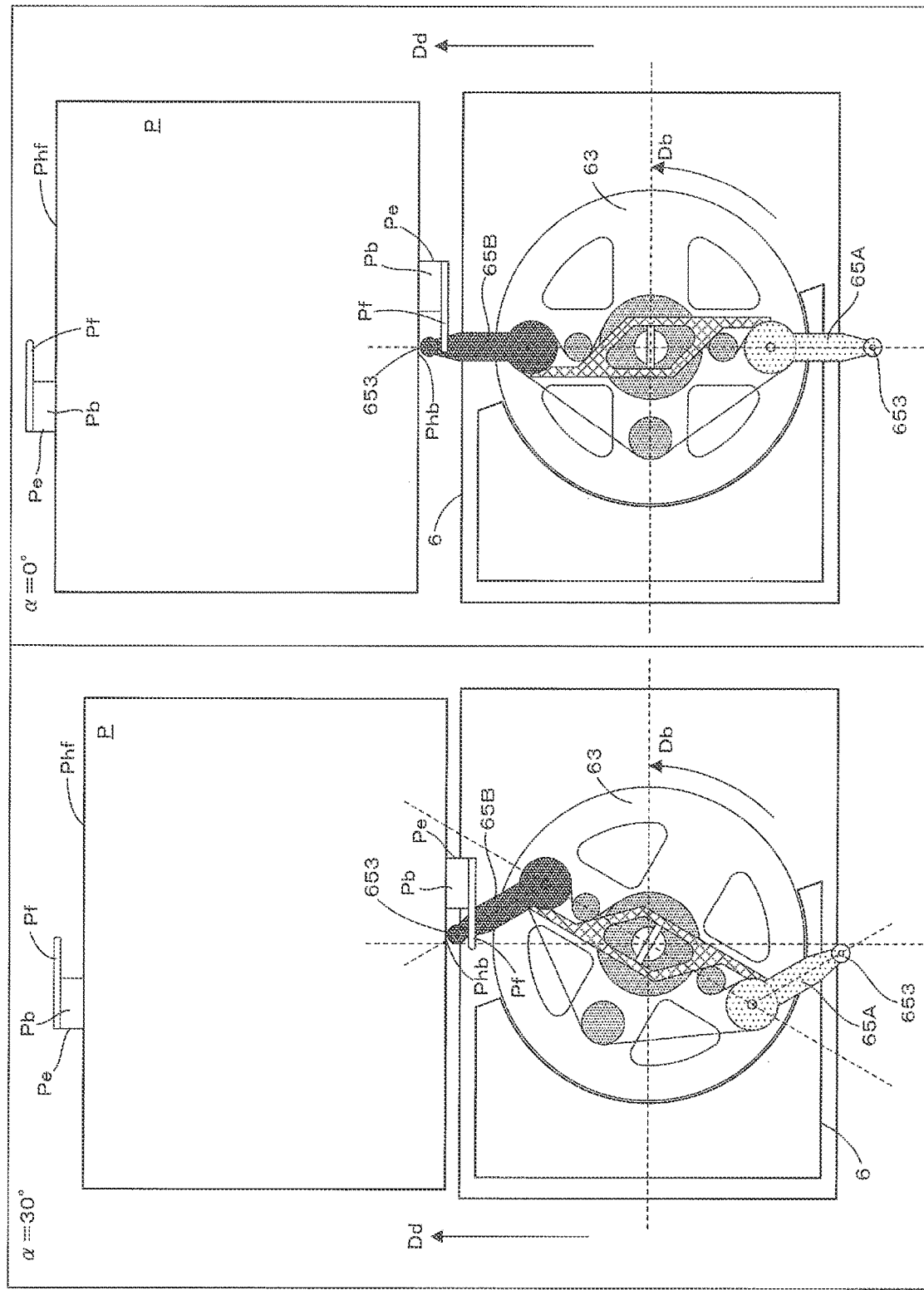

PALLET CONVEYING APPARATUS, COMPONENT MOUNTER, PALLET CONVEYING METHOD

This application is a National Stage of International Patent Application No. PCT/JP2019/003585, filed Feb. 1, 2019, the entire contents of which is incorporated herein by reference.

BACKGROUND

Technical Field

This disclosure relates to a technique for conveying a pallet having components placed thereon.

Background Art

Conventionally, a component mounter is known which conveys a pallet from a pallet storage for storing the pallet having components placed thereon to a predetermined component supply position and mounts the component taken out from the pallet at the component supply position on a board. In such a component mounter, the pallet needs to be conveyed to the component supply position. For example, in JP3884278, a mechanism for conveying a pallet by turning an engaging member (projecting part) engaged with a hook part of the pallet is proposed for the purpose of space saving and the like.

SUMMARY

As just described, in the above configuration, a path of the engaging member engaged with the pallet is circular. However, it is preferred to move the engaging member engaged with the pallet along a path close to a straight line in terms of smoothly conveying the pallet.

This disclosure was developed in view of the above problem and aims to provide a technique conveying a pallet while moving an engaging member engaged with the pallet along a path close to a straight line.

A pallet conveying apparatus according to the disclosure, comprises a base; a main rotary body mounted on the base turnably about a main turning axis; a driver which turns the main rotary body about the main turning axis with respect to the base; an auxiliary rotary body mounted on the main rotary body turnably about an auxiliary turning axis parallel to the main turning axis and separated from the main turning axis; and a turning transmitter which turns the auxiliary rotary body with respect to the main rotary body in a direction opposite to a turning direction of the main rotary body by transmitting the turning of the main turning body with respect to the base to the auxiliary rotary body. The auxiliary rotary body includes an engaging member engageable with a pallet having components placed thereon at a position separated from the auxiliary turning axis. If the main rotary body turns about the main turning axis, the auxiliary rotary body displaces the engaging member in a conveying direction orthogonal to the main turning axis to convey the pallet engaged with the engaging member in the conveying direction by turning about the auxiliary turning axis with respect to the main rotary body in the direction opposite to the turning direction of the main rotary body while turning about the main turning axis with respect to the base together with the main rotary body.

A pallet conveying method according to the disclosure, comprises: engaging an engaging member of an auxiliary rotary body turnably mounted on a main rotary body about an auxiliary turning axis with a pallet having components placed thereon, the auxiliary turning axis being parallel to a main turning axis of the main rotary body and separated from the main turning axis; and turning the auxiliary rotary body with respect to the main rotary body in a direction opposite to a turning direction of the main rotary body by turning the main rotary body about the main turning axis and transmitting the turning of the main rotary body to the auxiliary rotary body, wherein: the engaging member of the auxiliary rotary body is provided at a position separated from the auxiliary turning axis, and if the main rotary body turns about the main turning axis, the auxiliary rotary body displaces the engaging member in a conveying direction orthogonal to the main turning axis to convey the pallet engaged with the engaging member in the conveying direction by turning about the auxiliary turning axis with respect to the main rotary body in the direction opposite to the turning direction of the main rotary body while turning about the main turning axis together with the main rotary body.

In the disclosure (pallet conveying apparatus, pallet conveying method) thus configured, the main rotary body turnable about the main turning axis and the auxiliary rotary body mounted on the main turning axis turnably about the auxiliary turning axis separated from the main turning axis are provided, and the pallet is conveyed by the engaging member provided on the auxiliary rotary body by transmitting the turning of the main rotary body to the auxiliary rotary body. Particularly, the auxiliary rotary body displaces the engaging member in the conveying direction orthogonal to the main turning axis by turning about the auxiliary turning axis with respect to the main rotary body in the direction opposite to the turning direction of the main rotary body while turning about the main turning axis together with the main rotary body. Thus, the engaging member moves along a path relatively close to a straight line. In this way, the pallet can be conveyed while the engaging member engaged with the pallet is moved along the path close to the straight line.

The pallet conveying apparatus may be configured so that the turning transmitter turns the auxiliary rotary body about the auxiliary turning axis with respect to the main rotary body at an angle twice the turning angle of the main rotary body about the main turning axis with respect to the base. In this way, the pallet engaged with the engaging member can be conveyed while the engaging member is moved along the path closer to the straight line.

The pallet conveying apparatus, which pulls out the pallet from a pallet storage storing the pallet, may be configured so that the engaging member of the auxiliary rotary body moves to a position to be engaged with the pallet stored in the pallet storage by turning about the main turning axis with respect to the base together with the main rotary body from a state separated from the pallet stored in the pallet storage, and the turning transmitter restricts the turning of the auxiliary rotary body with respect to the main rotary body by cutting off the transmission of the turning of the main rotary body with respect to the base to the auxiliary rotary body until the engaging member is engaged with the pallet stored in the pallet storage, and starts the transmission of the turning of the main rotary body with respect to the base to the auxiliary rotary body to turn the auxiliary rotary body with respect to the main rotary body if the engaging member is engaged with the pallet stored in the pallet storage. In such a configuration, the engaging member of the auxiliary rotary body moves to the position to be engaged with the pallet by turning together with the main rotary body from the state separated from the pallet stored in the pallet storage. At this time, the turning of the engaging member with respect to the main rotary body is restricted until the engaging member is engaged with the pallet, and the turning of the engaging member with respect to the main rotary body is started after the pallet is engaged with the engaging member. Thus, the pallet can be conveyed in the conveying direction by starting a displacement of the engaging member in the conveying direction after the engaging member is precisely engaged with the pallet in a state where the displacement of the engaging member in the conveying direction is suppressed.

The pallet conveying apparatus may be configured so that the engaging member is a roller turnable about a roller axis parallel to the main turning axis. In such a configuration, the engaging member can be smoothly engaged with the pallet regardless of friction generated between the engaging member and the pallet.

Note that various specific configurations of the auxiliary rotary body are considered. The pallet conveying apparatus may be configured so that the auxiliary rotary body includes an arm configured to turn about the auxiliary turning axis and the engaging member is provided on an end part of the arm opposite to the auxiliary turning axis.

The pallet conveying apparatus may be configured so that two auxiliary rotary bodies are mounted on the main rotary body; and the pallet conveying apparatus further comprises an engagement switcher which switches a state where the engaging member of one auxiliary rotary body of the two auxiliary rotary bodies is selectively engaged with the pallet and a state where the engaging member of other auxiliary rotary body is selectively engaged with the pallet. In this way, a long conveyance distance of the pallet can be secured by conveying the pallet using the respective engaging members of the two auxiliary rotary bodies.

The pallet conveying apparatus may configured so that the engagement switcher retracts the other auxiliary rotary body from a conveyance path of the pallet in a state where the engaging member of the one auxiliary rotary body is engaged with the pallet and retracts the one auxiliary rotary body from the conveyance path in a state where the engaging member of the other auxiliary rotary body is engaged with the pallet. In such a configuration, the auxiliary rotary body not used to convey the pallet can be prevented from hindering the conveyance of the pallet.

The pallet conveying apparatus may be configured so that the engagement switcher includes a swing member with one end part having the one auxiliary rotary body mounted thereon and other end part having the other auxiliary rotary body mounted thereon and a support member which swingably supports the swing member between the one end part and the other end part, and switches the auxiliary rotary body to be engaged with the pallet between the one auxiliary rotary body and the other auxiliary rotary body by swinging the swing member. In such a configuration, the auxiliary rotary body to be engaged with the pallet can be switched by a simple operation of swinging the swing member.

The pallet conveying apparatus, which pulls out the pallet in a pull-out direction parallel to the conveying direction from a pallet storage storing the pallet toward a component supply position by way of a relay position, may be configured so that the pallet includes a front engagement part and a rear engagement part provided upstream of the front engagement part in the pull-out direction. The pallet conveying apparatus successively performs an operation of engaging the engaging member of the one auxiliary rotary body with the front engagement part of the pallet stored in the pallet storage in a state where the engaging member of the one auxiliary rotary body is located upstream of the engaging member of the other auxiliary rotary body in the pull-out direction; an operation of pulling the pallet engaged with the engaging member of the one auxiliary rotary body in the pull-out direction to convey the pallet to the relay position and locating the engaging member of the other auxiliary rotary body upstream of the rear engagement part of the pallet located at the relay position in the pull-out direction by turning the main rotary body about the main turning axis in a first direction until the engaging member of the one auxiliary rotary body moves at least to a side downstream of the engaging member of the other auxiliary rotary body in the pull-out direction; an operation of engaging the engaging member of the other auxiliary rotary body with the rear engagement part of the pallet conveyed to the relay position; and an operation of pushing the pallet engaged with the engaging member of the other auxiliary rotary body in the pull-out direction to convey the pallet to the component supply position by turning the main rotary body about the main turning axis in a second direction opposite to the first direction. In such a configuration, the pallet can be pushed from the relay position to the component supply position by the other auxiliary rotary body after being pulled out from the pallet storage to the relay position by the one auxiliary rotary body. In this way, a long conveyance distance of the pallet can be secured.

The pallet conveying apparatus may be configured so that a passage path of the one auxiliary rotary body and a passage path of the other auxiliary rotary body do not overlap through each operation in a plan view from a direction parallel to the main turning axis. In such a configuration, the pallet can be smoothly conveyed while the collision of the one and the other auxiliary rotary bodies is prevented.

The pallet conveying apparatus may be configured so that the auxiliary turning axis of the one auxiliary rotary body and the auxiliary turning axis of the other auxiliary rotary body are point-symmetrically arranged with respect to the main rotary axis in a plan view from a direction parallel to the main turning axis. In this way, a long conveyance distance of the pallet can be secured.

A component mounter according to the disclosure, comprises a pallet storage which stores a pallet having components placed thereon; the pallet conveying apparatus as discussed herein; and a mounting head which mounts the component placed on the pallet conveyed from the pallet storage to a component supply position by the pallet conveying apparatus on a board. Therefore, the pallet can be conveyed while the engaging member engaged with the pallet is moved along the path close to the straight line.

According to the disclosure, a pallet can be conveyed while an engaging member engaged with the pallet is moved along a path close to a straight line.

BRIEF DESCRIPTION OF THE DRAWINGS

FIG. 6A is plan view schematically showing an example of a pallet pull-out operation performed by the pallet conveying apparatus shown in FIG. 2;

FIG. 6B is plan view schematically showing an example of a pallet pull-out operation performed by the pallet conveying apparatus shown in FIG. 2;

FIG. 6C is plan view schematically showing an example of a pallet pull-out operation performed by the pallet conveying apparatus shown in FIG. 2;

FIG. 6D is plan view schematically showing an example of a pallet pull-out operation performed by the pallet conveying apparatus shown in FIG. 2;

FIG. 6E is plan view schematically showing an example of a pallet pull-out operation performed by the pallet conveying apparatus shown in FIG. 2;

FIG. 6F is plan view schematically showing an example of a pallet pull-out operation performed by the pallet conveying apparatus shown in FIG. 2; and FIG. 6G is plan view schematically showing an example of a pallet pull-out operation performed by the pallet conveying apparatus shown in FIG. 2.

DETAILED DESCRIPTION

Figure 1:
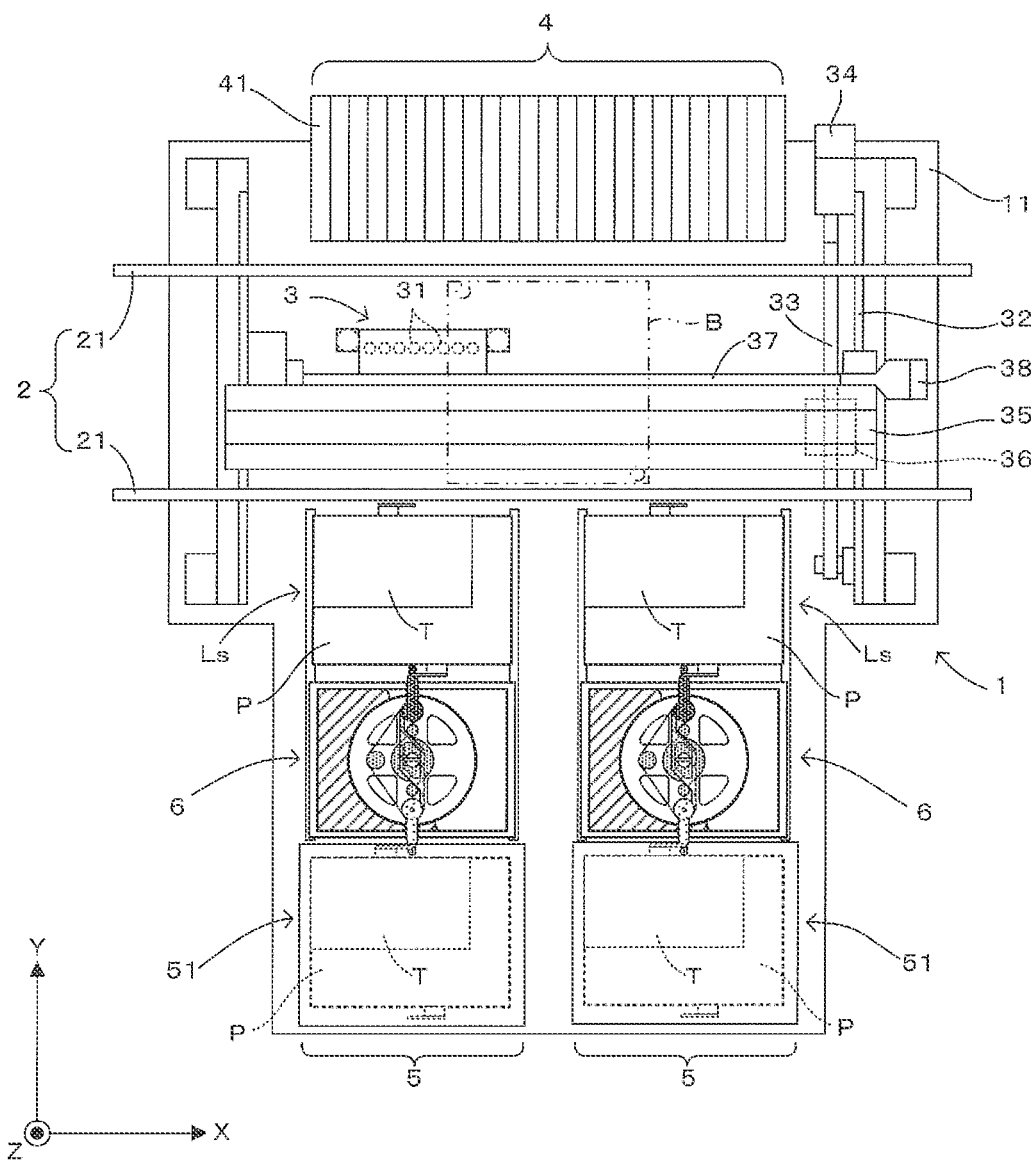
FIG. 1 is a plan view schematically showing an example of a component mounter according to the disclosure.

FIG. 1 is a plan view schematically showing an example of a component mounter according to the disclosure. In FIG. 1 and subsequent figures, an XYZ orthogonal coordinate system composed of an X direction, a Y direction and a Z direction orthogonal to each other is shown as appropriate. Here, the X and Y directions are respectively horizontal directions and the Z direction is a vertical direction. In this component mounter 1, a head unit 3 mounts components supplied by component suppliers 4, 5 on a board B carried in by a board conveyor 2.

In the component mounter 1, the board conveyor 2 which conveys the board B in the X direction (board conveying direction) is arranged on a base 11. The board conveyor 2 includes two conveyors 21 respectively extending in the X direction. The two conveyors 21 are arranged in parallel while being spaced apart by a distance corresponding to a width of the board B in the Y direction (width direction), conveys the board B carried in from an upstream side in the X direction to a downstream side in the X direction and stops the board B at a predetermined mounting operation position (position of the board B in FIG. 1). Note that the board B stopped at the mounting operation position is fixed at the mounting operation position by an unillustrated holding mechanism. Further, the two conveyors 21 carry out the board B having the components mounted at the mounting operation position to the downstream side in the X direction from the mounting operation position.

The head unit 3 transfers the components supplied by the component suppliers 4, 5 to the board B fixed at the mounting operation position. The head unit 3 includes a plurality of mounting heads 31 arranged in the X direction, and suction nozzles are attached to the lower ends of the respective mounting heads 31. The head unit 3 moves in the X and Y directions above the conveyors 21, thereby picking up the components supplied from the component suppliers 4, 5 by the suction nozzles and transferring the components to the board B at the mounting operation position. Such a head unit 3 is moved by the following driving mechanism.

That is, a pair of Y-axis fixed rails 32 respectively provided in parallel to the Y direction, a Y-axis ball screw 33 provided in parallel to the Y direction and a Y-axis servo motor 34 turning the Y-axis ball screw 33 are arranged on the base 11. An X-axis beam 35 extending in the X direction is laid over the pair of Y-axis fixed rails 32. This X-axis beam 35 is supported movably in the Y direction by the Y-axis fixed rails 32, and a nut 36 mounted on the X-axis beam 35 is threadably engaged with the Y-axis ball screw 33. An X-axis rail (not shown) provided in parallel to the X direction, an X-axis ball screw 37 provided in parallel to the X direction and an X-axis servo motor 38 turning the X-axis ball screw 37 are mounted on this X-axis beam 35. The head unit 3 is supported movably in the X direction by an X-axis guide, and a nut (not shown) mounted on the head unit 3 is threadably engaged with the X-axis ball screw 37.

Accordingly, if the Y-axis servo motor 34 turns the Y-axis ball screw 33, the head unit 3 moves in the Y direction according to a movement of the X-axis beam 35. Further, if the X-axis servo motor 38 turns the X-axis ball screw 37, the head unit 3 moves in the X direction. In this way, the head unit 3 moves between positions above the component suppliers 4, 5 and a position above the mounting operation position to pick up and transfer the components.

The component supplier 4 is arranged on a front side (one side in the Y direction) of the board conveyor 2. The component supplier 4 includes a plurality of tape feeders 41 arranged in the X direction. Each tape feeder 41 is configured to draw out a tape storing relatively small-size chip components such as ICs (Integrated Circuits), transistors and capacitors at predetermined intervals from a reel, and the components intermittently fed by each tape feeder 41 are picked up by the head unit 3 and transferred to the board B at the mounting operation position.

The component suppliers 5 are arranged on a rear side (other side in the Y direction) of the board conveyor 2. In an example shown in FIG. 1, two component suppliers 5 are arranged in the X direction. However, since these have a mutually common configuration and perform a similar operation, one component supplier 5 is basically described below.

The component supplier 5 supplies relatively large-size package components such as QFPs (Quad Flat Packages) and BGAs (Ball Grid Arrays). Specifically, the component supplier 5 includes a pallet exchanger 51 which stores pallets P and a pallet conveying apparatus 6 which conveys the pallet P in the Y direction between the pallet exchanger 51 and a component supply position Ls. Components are placed on the pallet P via a tray T, and a plurality of package components are arrayed on this tray T. The pallet P supports one or more trays T in a fixed state by a magnetic force or the like.

The pallet exchanger 51 has a configuration similar to that of a tray storage described in Publication of Japanese Patent No. 3884278. That is, the pallet exchanger 51 stores a plurality of the pallets P arranged in the Z direction. Out of the plurality of pallets P, the pallet P located at a height corresponding to the pallet conveying apparatus 6 can be carried out from the pallet exchanger 51 by the pallet conveying apparatus 6. The pallet exchanger 51 moves up and down in the Z direction, thereby switching the pallet P located at the height corresponding to the pallet conveying apparatus 6 and changing the pallet P to be carried out by the pallet conveying apparatus 6. By conveying the pallet P from the pallet exchanger 51 to the component supply position Ls by the pallet conveying apparatus 6, the components are supplied. That is, the components on the pallet P conveyed to the component supply position Ls are picked up and transferred to the board B at the mounting operation position by the head unit 3.

Figure 2:
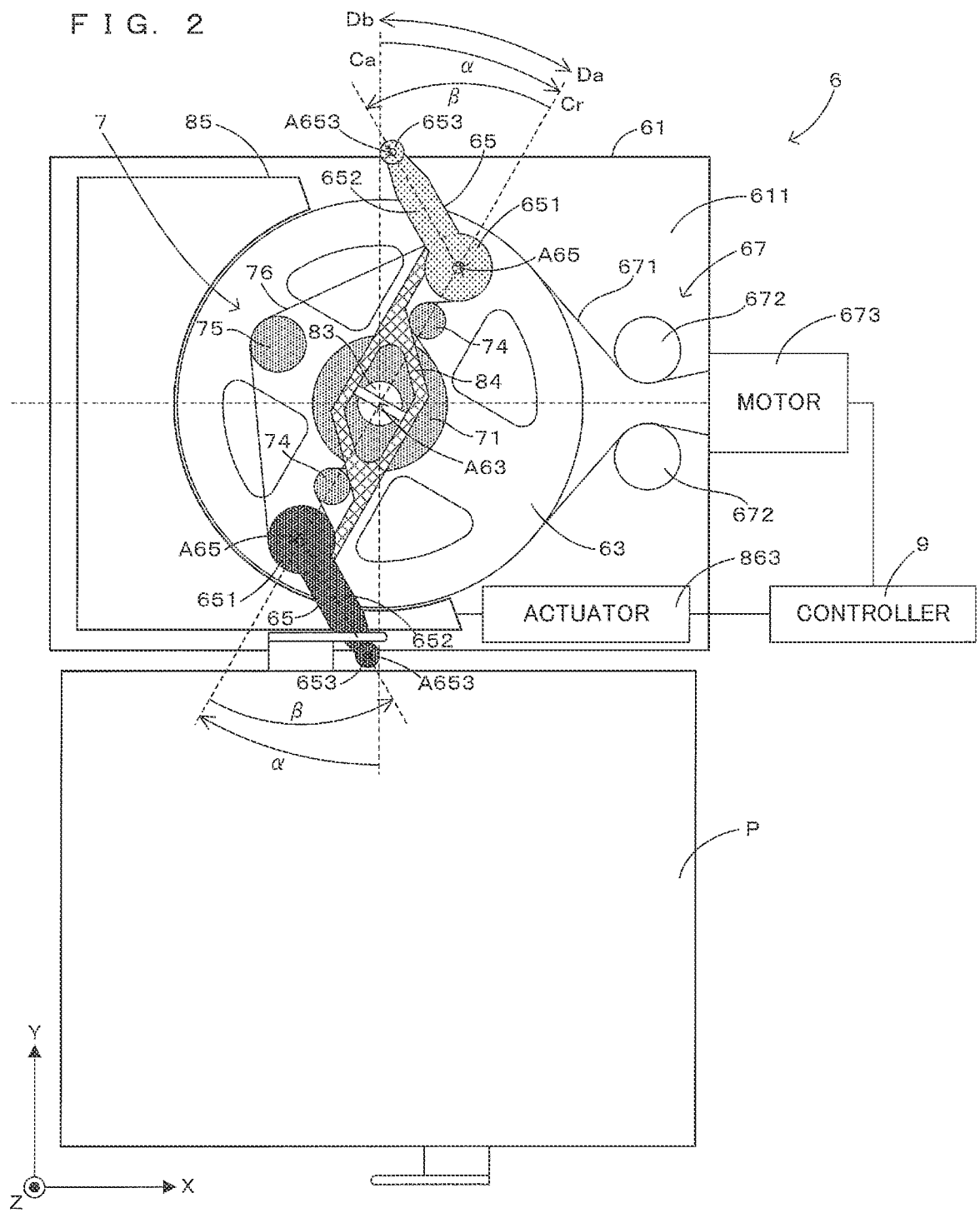
FIG. 2 is a plan view schematically showing the configuration of the pallet conveying apparatus.
Figure 3:
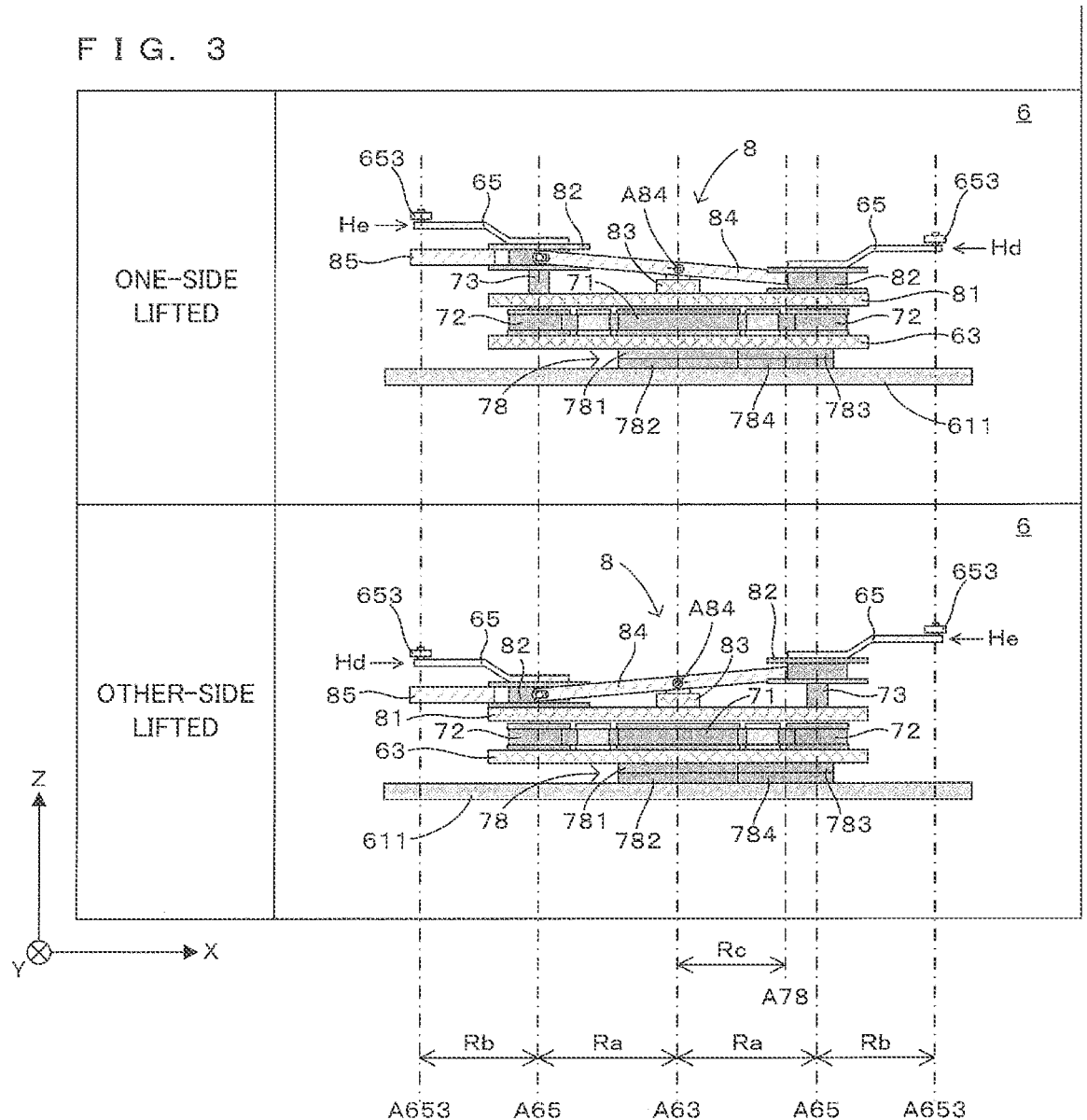
FIG. 3 show side views schematically showing the configuration of the pallet conveying apparatus of FIG. 2.

FIG. 2 is a plan view schematically showing the configuration of the pallet conveying apparatus, and FIG. 3 show side views schematically showing the configuration of the pallet conveying apparatus of FIG. 2. In these figures and subsequent figures showing the pallet conveying apparatus 6, the configuration of the pallet conveying apparatus 6 is partially omitted as appropriate. Further, the pallet P is shown in addition to the pallet conveying apparatus 6 in FIG. 2, and two different states ("one-side lifted" and "other-side lifted") of the pallet conveying apparatus 6 are shown in FIG. 3.

By the way, in the following description, terms "rotation" and "revolution" are used as appropriate in describing the turning of an object. Here, "rotation" indicates a turning movement of the object about a turning axis overlapping the object, and "revolution" means a turning movement of the object about a turning axis separated from the object.

The pallet conveying apparatus 6 includes a box-shaped casing 61 open upward, a turntable 63 arranged above a bottom plate 611 of the casing 61 and two turning hooks 65 arranged above the turntable 63. The turntable 63 is mounted on the bottom plate 611 in a state turnable with respect to the bottom plate 611, and each of the two turning hooks 65 is mounted on the turntable 63 in a state turnable with respect to the turntable 63. The pallet conveying apparatus 6 conveys the pallet P engaged with the turning hook 65 by turning the turning hook 65 in conjunction with the turning of the turntable 63.

The turntable 63 is a pulley having a disk shape centered on a table turning axis A63 parallel to the Z direction. This turntable 63 can turn (rotate) about the table turning axis A63 with respect to the bottom plate 611 of the casing 61.

Each turning hook 65 has the same configuration except the arrangement thereof, and includes a disk 651 turnably mounted on the turntable 63, an arm 652 extending laterally from the disk 651 and an engaging roller 653 mounted on a tip part of the arm 652. The disk 651 is arranged with a hook turning axis A65 parallel to the Z direction as a center, and turnable (rotatable) about the hook turning axis A65 with respect to the turntable 63. The engaging roller 653 is mounted on an end part of the arm 652 opposite to the disk 651, and can turn (rotate) about a roller turning axis A653 parallel to the Z direction with respect to the arm 652.

The table turning axis A63 of the turntable 63 and the hook turning axis A65 of the turning hooks 65 are separated from each other by a distance Ra. Accordingly, if the turntable 63 turns (rotates) about the table turning axis A63, the hook turning axis A65 of the turning hooks 65 turn (revolve) along a circular path having a radius Ra about the table turning axis A63. Further, the hook turning axis A65 of the turning hook 65 (in other words, the disk 651) and the roller turning axis A653 of the engaging roller 653 are separated from each other by a distance Rb. Accordingly, if the turning hook 65 (in other words, the disk 651) turns (rotates) about the hook turning axis A65, the roller turning axis A653 of the engaging roller 653 turns (revolves) along a circular path having a radius Rb about the hook turning axis A65. That is, as the turntable 63 and the turning hook 65 turn, the engaging roller 653 moves along a path which is a composition of a turning path (revolution path) centered on the table turning axis A63 and a turning path (revolution path) centered on the hook turning axis A65. Note that, in a plan view from the Z direction, the respective hook turning axis A65 of the two turning hooks 65 are point-symmetrically located with respect to the table turning axis A63 of the turntable 63.

Further, the pallet conveying apparatus 6 includes a table driving mechanism 67 which turns the turntable 63 about the table turning axis A63 and a turning transmission mechanism 7 which transmits the turning of the turntable 63 to the two turning hooks 65.

The table driving mechanism 67 includes an endless belt 671 wound on the peripheral edge of the turntable 63, a pair of rollers 672 securing a winding angle of the endless belt 671 on the turntable 63 by contacting the endless belt 671 from outside, and a motor 673 driving the endless belt 671. The motor 673 turns the turntable 63 in contact with the inner side of the endless belt 671 about the table turning axis A63 by circulating the endless belt 671.

The turning transmission mechanism 7 includes a center pulley 71 arranged on the turntable 63 with the table turning axis A63 as a center. This center pulley 71 is mounted on the turntable 63 turnably about the table turning axis A63. Further, the turning transmission mechanism 7 includes hook pulleys 72 arranged with the hook turning axis A65 of the turning hooks 65 as centers. These hook pulleys 72 are arranged below the turning hooks 65 and turnably mounted on the turntable 63. That is, the hook pulley 72 can turn about the hook turning axis A65 with respect to the turntable 63.

Further, the turning transmission mechanism 7 includes cylindrical link bars 73 connecting the turning hooks 65 and the hook pulleys 72. The link bar 73 is provided in parallel to the Z direction with the hook turning axis A65 as a center, and the disk 651 of the turning hook 65 is fixed to the upper end of the link bar 73. The lower end of the link bar 73 is fit into a fit-in hole open in a center of the hook pulley 72 in the Z direction, and the link bar 73 and the hook pulley 72 are fixed to each other in a turning direction about the hook turning axis A65 and, on the other hand, movable relative to each other in the Z direction. Such a configuration can be realized, for example, by a key and a key groove extending in parallel to the Z direction. The hook pulley 72 and the link bar 73 are provided to correspond to each of the two turning hooks 65.

Further, the turning transmission mechanism 7 includes pulleys 74 arranged between the center pulley 71 and the hook pulleys 72, a pulley 75 arranged laterally to the center pulley 71, and an endless belt 76 wound on the center pulley 71, the hook pulleys 72 and the pulleys 74 and 75 on the turntable 63. The center pulley 71 and the hook pulleys 72 are in contact with the same side (inner side) of the endless belt 76, out of inner and outer sides of the endless belt 76.

Furthermore, the turning transmission mechanism 7 includes a transmission switcher 78 which switches a state where the center pulley 71 is stationary with respect to the bottom plate 611 of the casing 61 independently of the turning of the turntable 63 and a state where the center pulley 71 is turned integrally with the turntable 63. The configuration of the transmission switcher 78 is described in detail later. Here, the operation of the turning transmission mechanism 7 in each state is described.

In the state where the center pulley 71 is stationary with respect to the bottom plate 611, if the turntable 63 turns in a turning direction Da with respect to the bottom plate 611 as shown in FIG. 2, the center pulley 71 relatively turns with respect to the turntable 63 in a turning direction Db opposite to the turning direction Da. The turning of the center pulley 71 with respect to the turntable 63 in the turning direction Db is transmitted to the hook pulleys 72 to turn the hook pulleys 72 in the turning direction Db. A diameter of the center pulley 71 is twice those of the hook pulleys 72 and a speed increasing ratio is two-fold. Thus, an angular velocity of the turning hooks 65 is twice that of the turntable 63. That is, if the turntable 63 turns by an angle α in the turning direction Da as shown in FIG. 2, the turning hooks 65 turn by an angle β (=2×α) in the turning direction Db.

Here, as shown in a plan view of FIG. 2, the turning angle α of the turntable 63 is shown as a turning angle of the turntable 63 with respect to an absolute reference axis Ca (i.e. reference axis fixed to the bottom plate 611) passing through the table turning axis A63 and parallel to the Y direction and it is assumed that the hook turning axis A65 of each turning hook 65 is located on the absolute reference axis Ca when the turning angle α of the turntable 63 is 0°. The turning angle β of the turning hook 65 is shown as a turning angle of the turning hook 65 with respect to a relative reference axis Cr (i.e. reference axis fixed to the turntable 63) inclined by the angle α with respect to the absolute reference axis Ca. Specifically, an angle between a straight line passing through the hook turning axes A65 and the roller turning axes A653 and the relative reference axis Cr is equivalent to the turning angle β of the turning hooks 65. When the turning angle α of the turntable 63 is 0°, the turning angle β of the turning hooks 65 is 0° and the engaging rollers 653 are located on sides (radially outer sides of the turntable 63) opposite to the table turning axis A63 with respect to the hook turning axes A65. The turning angles α, β are similarly shown in following the figures.

In such a configuration, the engaging roller 653 of the turning hook 65 turns in a direction opposite to the turning direction of the turntable 63 by the turning angle β (=2×α) about the hook turning axis A65 while turning by the turning angle α about the table turning axis A63 (interlocking operation). Note that the turning of the turntable 63 is similarly transmitted to each of the two turning hooks 65, and the engaging roller 653 of each of the two turning hooks 65 moves while maintaining a point-symmetrical relationship with respect to the table turning axis A63.

The above operation is performed in the stationary state of the center pulley 71. On the other hand, in the state where the center pulley 71 turns with respect to the bottom plate 611 integrally with the turntable 63, the operation is different. In this case, since the center pulley 71 is relatively stationary with respect to the turntable 63, power transmission from the turntable 63 to the turning hooks 65 by the center pulley 71 is cut off. Thus, the turning hooks 65 turn with respect to the bottom plate 611 together with the turntable 63 about the table turning axis A63 while being stationary with respect to the turntable 63 in the turning directions about the hook turning axes A65. Therefore, the engaging roller 653 of each of the two turning hooks 65 turns about the table turning axis A63 integrally with the turntable 63 while the turning angles of the two turning hooks 65 with respect to the relative reference axis Cr are kept at 0° (non-interlocking operation).

Next, the transmission switcher 78 included in the turning transmission mechanism 7 is described. This transmission switcher 78 includes an upper center gear 781, a lower center gear 782, an upper side gear 783 and a lower side gear 784 arranged between the bottom plate 611 of the casing 61 and the turntable 63. The upper center gear 781 is arranged with the table turning axis A63 as a center and mounted on the turntable 63 turnably about the table turning axis A63. The upper center gear 781 and the center pulley 71 are fixed to each other, and integrally turned and stopped with respect to the bottom plate 611. The lower center gear 782 is arranged between the upper center gear 781 and the bottom plate 611 with the table turning axis A63 as a center. This lower center gear 782 is fixed to the bottom plate 611 and separated from and independent of the upper center gear 781.

The upper and lower side gears 783, 784 (hereinafter, referred to as "side gears 783, 784" as appropriate) are vertically stacked with a gear turning axis A78 parallel to the Z direction as a center, and arranged laterally to the upper and lower center gears 781, 782. The upper side gear 783 laterally contacts the upper center gear 781, and the lower side gear 784 laterally contacts the lower center gear 782. These side gears 783, 784 are mounted on the turntable 63 turnably about the gear turning axis A78 while being fixed to each other, and integrally operate. Note that the side gears 783, 784 are separated from and independent of the bottom plate 611.

The table turning axis A63 of the turntable 63 and the gear turning axis A78 of the side gears 783, 784 are separated from each other by a distance Rc. Accordingly, if the turntable 63 turns (rotates) about the table turning axis A63, the gear turning axis A78 of the side gears 783, 784 turns (revolves) along a circular path having a radius Rc about the table turning axis A63, and the side gears 783, 784 turn (revolve) around the upper and lower center gears 781, 782 while contacting these gears 781, 782. At this time, the lower side gear 784 is constantly engaged with the lower center gear 782 fixed to the bottom plate 611. Thus, the side gears 783, 784 are stationary with respect to the bottom plate 611 (in other words, turns with respect to the turntable 63) in a turning direction about the gear turning axis A78 while turning about the table turning axis A63 with respect to the bottom plate 611. On the other hand, the upper side gear 783 and the upper center gear 781 are not constantly engaged. Thus, the operation of the upper center gear 781 may be independent of the operation of the side gears 783, 784 in some cases and may be dependent on the operation of the side gears 783, 784 in other cases according these positional relationships. This point is described using FIG. 4.

Figure 4:
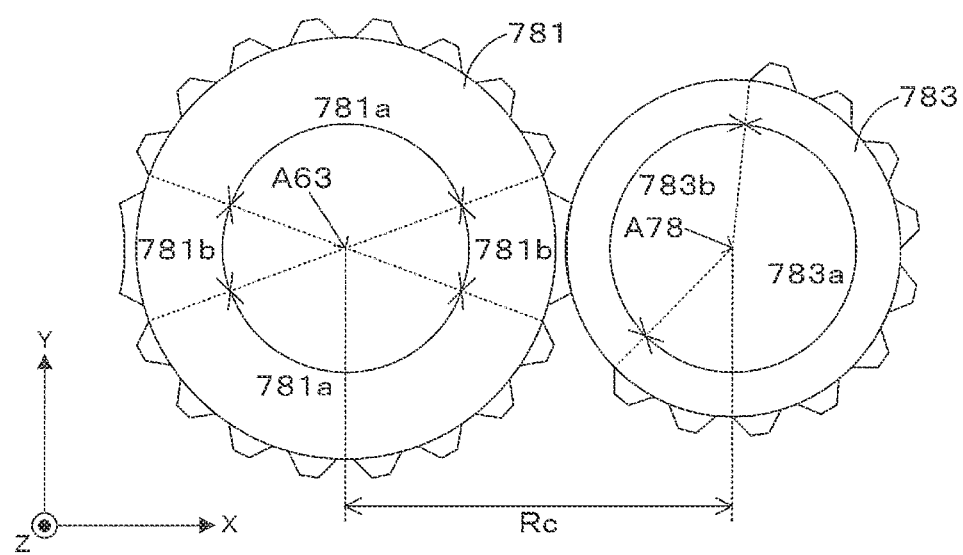
FIG. 4 is a plan view schematically showing a relationship of the upper center gear and the upper side gear.

FIG. 4 is a plan view schematically showing a relationship of the upper center gear and the upper side gear. As shown in FIG. 4, the upper side gear 783 is an intermittent gear having teeth in an angle range 783a, but having no teeth in an angle range 783b. Further, the upper center gear 781 is an intermittent gear having teeth in angle ranges 781a, but having no teeth in angle ranges 781b. As described above, the upper side gear 783 is stationary about the gear turning axis A78 in the turning direction while turning about the table turning axis A63 according to the turning of the turntable 63. As a result, there are a disengaged state where the upper side gear 783 and the upper center gear 781 are in contact, but not engaged in the angle ranges 783b, 781b and an engaged state where the upper side gear 783 and the upper center gear 781 are in contact and engaged with each other in the angle ranges 783a, 781a.

In the engaged state, the upper center gear 781 is connected to the lower center gear 782 fixed to the bottom plate 611 via the side gears 783, 784. Thus, the upper center gear 781 is stationary with respect to the bottom plate 611, and the center pulley 71 fixed to the upper center gear 781 is also stationary with respect to the bottom plate 611. As a result, the engaging roller 653 of each turning hook 65 performs the aforementioned interlocking operation.

On the other hand, in the disengaged state, the upper center gear 781 is independent of the upper side gear 783. Further, since the turning of the upper center gear 781 is hindered while halfmoon-shaped irregularities of the upper side gear 783 are meshed, the center gear 781 is stationary with respect to the side gear 783. Thus, the upper center gear 781 turns integrally with the turntable 63 and the center pulley 71 fixed to the upper center gear 781 also turns integrally with the turntable 63. As a result, the engaging roller 653 of each turning hook 65 performs the aforementioned non-interlocking operation.

By the way, two turning hooks 65 are provided in the pallet conveying apparatus 6. In view of this, the pallet conveying apparatus 6 includes an engagement switching mechanism 8 which engages one of the two turning hooks 65 with the pallet P while separating the other from the pallet P (FIG. 3). That is, each turning hook 65 can be selectively set at either one of an engaged position He and a separated position Hd by moving up and down between the engaged position He and the separated position Hd lower than the engaged position He. The engaging roller 653 of the turning hook 65 located at the engaged position He is engaged with the pallet P, whereas the engaging roller 653 of the turning hook 65 located at the separated position Hd is separated from the pallet P. Particularly, the engagement switching mechanism 8 switches the turning hook 65 to be engaged with the pallet P so that, out of the two turning hooks 65, the other turning hook 65 is located at the separated position Hd if the one turning hook 65 is located at the engaged position He, and the other turning hook 65 is located at the engaged position He if the one turning hook 65 is located at the separated position Hd.

This engagement switching mechanism 8 includes a circular support table 81 arranged above the turntable 63 with the table turning axis A63 as a center. The support table 81 turns about the table turning axis A63 integrally with the turntable 63. The aforementioned center pulley 71, hook pulleys 72 and pulleys 74, 75 are arranged between the support table 81 and the turntable 63, whereas each turning hook 65 is arranged above the support table 81. The link bars 73 are passed through the support table 81 in the Z direction via through holes provided in the support table 81.

Further, the engagement switching mechanism 8 includes lift brackets 82 arranged between the turning hook 65 and the support table 81 with the hook turning axes A65 as centers. A through hole is provided in a center of the lifting bracket 82, and the link bar 73 is passed through the lifting bracket 82 in the Z direction via this through hole. The lifting bracket 82 can move up and down along the link bar 73, and can turn about the hook turning axis A65 with respect to the link bar 73. This lifting bracket 82 is provided for each of the two turning hooks 65, and supports the corresponding turning hook 65 from below.

Furthermore, the engagement switching mechanism 8 includes a supporter 83 provided in a center of the turntable 63 in a plan view from the Z direction, and a swing bar 84 swingably supported by the supporter 83. One end of the swing bar 84 is engaged with one of the two lifting brackets 82, and the other end of the swing bar 84 is engaged with the other lifting bracket 82. A swing axis A84 of the swing bar 84 is parallel to a horizontal direction, and located in a center between both ends (one end and the other end) of the swing bar 84. The supporter 83 supports the swing bar 84 swingably about the swing axis A84. Therefore, the two lifting brackets 82 move up and down like a seesaw as the swing bar 84 swings.

Further, the engagement switching mechanism 8 includes a lifting plate 85 movable up and down in the Z direction, and the lifting plate 85 is engaged with one of the two lifting brackets 82. As shown in FIG. 2, this lifting plate 85 is provided to include a movable range of the lifting brackets 82 according to a movement of the turntable 63 about the table turning axis A63 in the turning direction. If the lifting plate 85 moves up, one lifting bracket 82 moves up to locate the turning hook 65 supported by the one lifting bracket 82 at the engaged position He and the other lifting bracket 82 moves down to locate the turning hook 65 supported by the other lifting bracket 82 at the separated position Hd. Further, if the lifting plate 85 moves down, one lifting bracket 82 moves down to locate the turning hook 65 supported by the one lifting bracket 82 at the separated position Hd and the other lifting bracket 82 moves up to locate the turning hook 65 supported by the other lifting bracket 82 at the engaged position He.

Figure 5:
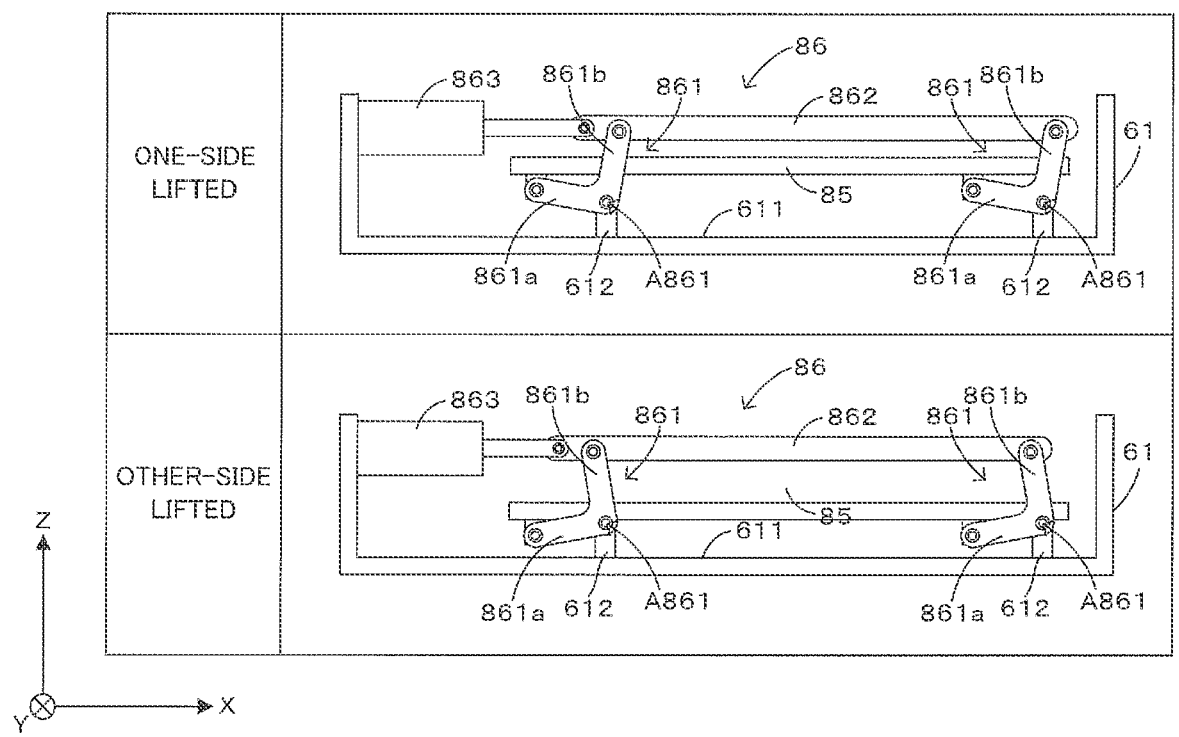
FIG. 5 show side views schematically showing the configuration of the plate lifting mechanism.

This engagement switching mechanism 8 includes a plate lifting mechanism 86 which moves up and down the lifting plate 85. FIG. 5 show side views schematically showing the configuration of the plate lifting mechanism. The plate lifting mechanism 86 includes a pair of swing brackets 861, each of which is L-shaped. Each swing bracket 861 is supported by a supporter 612 standing from the bottom plate 611 swingably about a swing axis A861 parallel to a horizontal direction. This swing bracket 861 includes an extending part 861a extending from the swing axis A861 and an extending part 861b extending from the swing axis A861 while being orthogonal to the extending part 861a. The tip of the extending part 861a of each swing bracket 861 is engaged with the lifting bracket 85. Further, the engagement switching mechanism 8 includes a horizontally extending horizontal link 862 and an actuator 863 which drives the horizontal link 862 in the horizontal direction, and the tip of the extending part 861b of each swing bracket 861 is engaged with the horizontal link 862. Therefore, the swing brackets 861 can be swung to move up and down the lifting bracket 85 by moving the horizontal link 862 in the horizontal direction by the actuator 863.

The above configuration is a mechanical configuration of the pallet conveying apparatus 6. This pallet conveying apparatus 6 includes a controller 9 which controls such a mechanical configuration. This controller 9 is a processor having a CPU (Central Processing Unit) and the like, and performs the following operation by giving commands to the motor 673 and the actuator 863.

FIGS. 6A to 6G are plan views schematically showing an example of a pallet pull-out operation performed by the pallet conveying apparatus shown in FIG. 2. In this pallet pull-out operation, the pallet P is pulled out in a pull-out direction Dd parallel to the Y direction from the position (pull-out start position Ld) of the pallet P supported in the pallet exchanger 51 to the component supply position Ls. Note that the pallet conveying apparatus 6 is arranged between the pull-out start position Ld and the component supply position Ls in a plan view. Although the pallet P passes above the pallet conveying apparatus 6 in the pallet pull-out operation, the configuration of the pallet conveying apparatus 6 is shown as appropriate through the pallet P in FIGS. 6A to 6G. Further, in FIGS. 6A to 6G, different reference signs 65A, 65B are given to distinguish the two turning hooks 65, and the turning hook 65 located at the engaged position He is indicated by dense dot hatching, and the turning hook 65 located at the separated position Hd is indicated by lighter dot hatching. In a state of FIGS. 6A to 6D, the turning hook 65A is located at the engaged position He and the turning hook 65B is located at the separated position Hd. In a state of FIGS. 6E to 6F, the turning hook 65A is located at the separated position Hd and the turning hook 65B is located at the engaged position He.

As shown in FIGS. 6A to 6G, the pallet P includes a housing Ph rectangular in a plan view and open upward, and two engaging projections Pe mounted on outer walls Phf, Phb of the housing Ph on both sides in the pull-out direction Dd, and the tray T is placed in the housing Ph. The housing Ph has two outer walls Phf, Phb orthogonal to the pull-out direction Pd. Out of the outer walls Phf, Phb, the outer wall Phf is provided on a downstream side in the pull-out direction Dd and the outer wall Phb is provided on an upstream side in the pull-out direction Dd. Each engaged projection Pe includes a bracket Pb mounted on the outer wall Phf, Phb of the pallet P in the pull-out direction Dd, and a flange Pf projecting from the bracket Pb in a direction orthogonal to the pull-out direction Dd. The bracket Pb of the engaging projection Pe on the downstream side (arrow side) in the pull-out direction Dd, out of the two engaging projections Pe, projects toward the downstream side in the pull-out direction Dd from the outer wall Phf of the housing Ph, and the bracket Pb of the engaged projection Pe on the upstream side (side opposite to an arrow) in the pull-out direction Dd projects toward the upstream side in the pull-out direction Dd from the outer wall Phb of the housing Ph. Further, projecting directions of the flanges Pf from the brackets Pb are opposite in the engaged projections Pe on the downstream and upstream sides in the pull-out direction Dd. In a plan view, these engaging projections Pe are arranged point-symmetrically with respect to a center of gravity of the pallet P.

As shown in a field "$\alpha=-10°$" of FIG. 6A, in the pallet pull-out operation, the turning of the turntable 63 in the turning direction Da is started from a state where the turning angle $\alpha$ of the turntable 63 in the turning direction Da is $-10°$ and the engaging roller 653 of the turning hook 65A is disengaged from the engaging projection Pe on an opposite side in the turning direction Da. If the turning angle $\alpha$ of the turntable 63 becomes 0° as shown in a field "$\alpha=0°$" of FIG. 6A, out of the turning hooks 65A and 65B, the turning hook 65A upstream of the table turning axis A63 in the pull-out direction Dd is located at the engaged position He and engaged with the pallet P at the pull-out start position Ld. Specifically, the engaging roller 653 of the turning hook 65A is engaged with the engaging projection Pe on the downstream side of the pallet P while being located upstream of the hook turning axis A65 of the turning hook 65A in the pull-out direction Dd. At this time, the turning hook 65B is located at the separated position Hd on a side downstream of the table turning axis A63 in the pull-out direction Dd while the engaging roller 653 thereof is located downstream of the hook turning axis A65 thereof in the pull-out direction Dd. Note that in a range of the turning angle $\alpha$ of $-10°$ to $0°$, the aforementioned disengaged state is realized. Thus, the turning hooks 65A, 65B move the engaging rollers 653 along the circular path centered on the table turning axis A63 while maintaining a state where straight lines passing through the hook turning axes A65 and the roller turning axes A653 coincide with radial directions of the turntable 63 (in other words, pass through the table turning axis A63).

If the turning angle $\alpha$ of the turntable 63 becomes 0° as shown in a field "$\alpha=0°$" of FIG. 6B, the engaging roller 653 of the turning hook 65A located at the engaging position He is engaged with the engaging projection Pe on the outer wall Phf of the pallet P located at the pull-out start position Ld and the aforementioned engaged state is started. Accordingly, the engaging roller 653 of the turning hook 65A starts the interlocking operation. Specifically, as shown in a field "$\alpha=30°$" of FIG. 6B, the engaging roller 653 of the turning hook 65A turns by the turning angle $\beta$ ($=2\times\alpha$) about the hook turning axis A65 in the turning direction Db opposite to the turning direction Da of the turntable 63 while turning by the turning angle $\alpha$ about the table turning axis A63. As a result, the engaging roller 653 of the turning hook 65A is displaced toward the downstream side in the pull-out direction Dd to pull the pallet P engaged with the engaging roller 653 toward the downstream side in the pull-out direction Dd from the pull-out start position Ld.

As shown in FIG. 6B, the turning hook 65B located at the separated position Hd also performs the interlocking operation in parallel with the interlocking operation of the engaging roller 653 of the turning hook 65A located at the engaging position He. Specifically, as shown in the field "$\alpha=30°$" of FIG. 6B, the engaging roller 653 of the turning hook 65B turns by the turning angle $\beta$ ($=2\times\alpha$) about the hook turning axis A65 in the direction Db opposite to the turning direction Da of the turntable 63 while turning by the turning angle $\alpha$ about the table turning axis A63. As a result, the engaging roller 653 of the turning hook 65B is displaced toward the upstream side in the pull-out direction Dd.

As is understood from FIGS. 6B to 6D, the engaging roller 653 of each turning hook 65A, 65B performs the interlocking operation as the turning angle $\alpha$ of the turntable 63 changes from 0° to 150°. That is, the engaging roller 653 of the turning hook 65A is displaced toward the downstream side in the pull-out direction Dd to pull the pallet P toward the downstream side in the pull-out direction D by turning by the turning angle $\beta$ ($=2>\alpha$) about the hook turning axis A65 in the direction Db opposite to the turning direction Da of the turntable 63 while turning by the turning angle $\alpha$ about the table turning axis A63. In parallel with this, the engaging roller 653 of the turning hook 65B is displaced toward the upstream side in the pull-out direction Dd by turning by the turning angle $\beta$ ($=2\times\alpha$) about the hook turning axis A65 in the direction Db opposite to the turning direction Da of the turntable 63 while turning by the turning angle $\alpha$ about the table turning axis A63.

As shown in a field "$\alpha=90°$" of FIG. 6C, the engaging roller 653 of the turning hook 65A moving toward the downstream side in the pull-out direction Dd and the engaging roller 653 of the turning hook 65B moving toward the upstream side in the pull-out direction Dd pass each other in the pull-out direction Dd while most approaching each other at a timing at which the turning angle $\alpha$ of the turntable 63 becomes 90°. Note that if a distance between the hook turning axis A65 and the tip of the engaging roller 653 on a straight line passing through the hook turning axis A65 and the roller turning axis A653 is a hook length 165, a distance 1$a$ between the hook turning axis A65 of the turning hook 65A and that of the turning hook 65B is longer than the sum of the hook length 165 of the turning hook 65A and that of the turning hook 65B. Therefore, the collision of the engaging rollers 653 of the turning hooks 65A, 65B is prevented in a state where these engaging rollers 653 are closest to each other.

Further, in a range where the turning angle $\alpha$ of the turntable 63 is less than 90°, the engaging roller 653 of the turning hook 65A moves on a side upstream of the table turning axis A63 in the pull-out direction Dd and the engaging roller 653 of the turning hook 65B moves on a side downstream of the table turning axis A63 in the pull-out direction Dd. On the other hand, in a range where the turning angle $\alpha$ of the turntable 63 is more than 90°, the engaging roller 653 of the turning hook 65A moves on the side downstream of the table turning axis A63 in the pull-out direction Dd and the engaging roller 653 of the turning hook 65B moves on the side downstream of the table turning axis A63 in the pull-out direction Dd. In this way, the positional relationship of the engaging roller 653 of the turning hook 65A and the engaging roller 653 of the turning hook 65B is reversed before and after the timing at which the turntable a becomes 90°.

Further, as is understood from the comparison of the field "α=90°" of FIG. 6C and a field "α=150°" of FIG. 6D, the relative positional relationship of the turning hook 65B and the pallet P changes according to the turning of the turntable 63, with the result that the engaging roller 653 of the turning hook 65B moves from the downstream side toward the upstream side of the housing Ph of the pallet P in the pull-out direction Dd. At this time, the engaging roller 653 of the turning hook 65B located at the separated position Hd is lower than a conveyance path (in other words, passage range of the pallet P) along which the pallet P is conveyed as the turning angle α of the turntable 63 changes. That is, the engaging roller 653 of the turning hook 65B located at the separated position Hd passes from the downstream side toward the upstream side in the pull-out direction Dd below the pallet P according to the turning of the turntable 63.

As shown in the field "α=150°" of FIG. 6D, the pallet P reaches a relay position Lm at a timing at which the turning angle α of the turntable 63 becomes 150°. This relay position Lm is located in the middle between the pull-out start position Ld and the component supply position Ls in the pull-out direction Dd. In this example, a center of gravity of the pallet P at the relay position Lm coincides with the table turning axis A63 of the turntable 63 in a plan view. Further, the engaging roller 653 of the turning hook 65B is facing a clearance between the outer wall Phb of the housing Ph of the pallet P located at the relay position Lm and the flange Pf of the engaging projection Pe provided on the outer wall Phb from below.

As is understood from the comparison of the fields "α=150°" of FIGS. 6D and 6E, the lifted states of the turning hooks 65A, 65B are switched from states where the turning hook 65A is located at the engaged position He and the turning hook 65B is located at the separated position Hd (field "α=150°" of FIG. 6D) to states where the turning hook 65A is located at the separated position Hd and the turning hook 65B is located at the engaged position He (field "α=150°" of FIG. 6E). Such a switch of the lifted states is performed by the engagement switching mechanism 8 as described above. In this way, the turning hook 65A is separated downward from the engaging projection Pe of the pallet P and the turning hook 65B is fit between the outer wall Phb of the pallet P and the flange Pf of the engaging projection Pe to be engaged with the outer wall Phb of the pallet P.

Further, the turning direction of the turntable 63 is reversed from the turning direction Da to the turning direction Db. As a result, as shown in FIGS. 6E to 6G, the engaging roller 653 of each turning hook 65A, 65B performs an operation opposite to the one shown in FIGS. 6B to 6D as the turning angle α of the turntable 63 changes from 150° to 0°. That is, the engaging roller 653 of each turning hook 65A, 65B moves back along a movement path according to the turning of the turntable 63 in the turning direction Da as the turntable 63 turns in the turning direction Db.

However, the engaging roller 653 of the turning hook 65B is engaged with the outer wall Phb of the pallet P. Thus, the pallet conveying apparatus 6 pushes the outer wall Phb of the pallet P toward the downstream side in the pull-out direction Dd by the engaging roller 653 of the turning hook 65B. In this way, the pallet P is conveyed from the relay position Lm to the component supply position Ls in the pull-out direction Dd.

Further, as a result of changing the relative positional relationship of the turning hook 65A and the pallet P according to the turning of the turntable 63, the engaging roller 653 of the turning hook 65A moves from the downstream side toward the upstream side of the housing Ph of the pallet P in the pull-out direction Dd. At this time, the engaging roller 653 of the turning hook 65A located at the separated position Hd is lower than the conveyance path (in other words, passage range of the pallet P) along which the pallet P is conveyed as the turning angle α of the turntable 63 changes. That is, the engaging roller 653 of the turning hook 65A located at the separated position Hd passes from the downstream side toward the upstream side in the pull-out direction Dd below the pallet P according to the turning of the turntable 63.

As described above, the pallet conveying apparatus 6 according to this embodiment is provided with the turntable 63 turnable about the table turning axis A63 and the turning hooks 65 mounted on the turntable 63 turnably about the hook turning axes A65 separated from the table turning axis A63. By transmitting the turning of the turntable 63 to the turning hooks 65, the pallet P is conveyed by the engaging rollers 653 provided on the turning hooks 65. Particularly, the turning hooks 65 displace the engaging rollers 653 in the pull-out direction Dd by turning about the hook turning axes A65 with respect to the turntable 63 in the direction opposite to the turning direction of the turntable 63 while turning about the table turning axis A63 together with the turntable 63. Thus, the engaging rollers 653 move along paths relatively close to straight lines. In this way, the pallet P can be conveyed while the engaging rollers 653 engaged with the pallet P are moved along the paths close to the straight lines.

Further, the pallet P can be conveyed at a high speed and the pallet conveying apparatus 6 can be configured to be compact.

Further, since the engaging rollers 653 are moved along the paths close to the straight lines in this way, the pallet P can be conveyed while the engaging rollers 653 are caused to face toward positions close to the center of gravity of the pallet P in the pull-out direction Dd. Thus, the pallet P can be stably conveyed.

Particularly, the turning transmission mechanism 7 turns the turning hooks 65 with respect to the turntable 63 at an angle twice the turning angle of the turntable 63 about the table turning axis A63 with respect to the bottom plate 611. In this way, the pallet P engaged with the engaging rollers 653 can be conveyed while the engaging rollers 653 are moved along the paths closer to the straight lines.

Further, the engaging roller 653 of the turning hook 65 moves to the position (angle α=β=0°) to be engaged with the pallet P stored in the pallet exchanger 51 by turning about the table turning axis A63 with respect to the bottom plate 611 together with the turntable 63 from a state where the engaging roller 653 is separated from the pallet P stored in the pallet exchanger 51 (field "α=−10°" of FIG. 6A). Further, the turning transmission mechanism 7 restricts the turning of the turning hook 65 with respect to the turntable 63 by cutting off the transmission of the turning of the turntable 63 with respect to the bottom plate 611 to the turning hook 65 until the engaging roller 653 is engaged with the pallet P stored in the pallet exchanger 51 (FIG. 6A). If the engaging roller 653 is engaged with the pallet P stored in the pallet exchanger 51, the transmission of the turning of the turntable 63 with respect to the bottom plate 611 to the turning hook 65 is started to turn the turning hook 65 with respect to the turntable 63. That is, the engaging roller 653 of the turning hook 65 moves to the position to be engaged with the pallet P by turning together with the turntable 63 from the state separated from the pallet P stored in the pallet exchanger 51. At this time, the turning of the engaging roller 653 with respect to the turntable 63 is restricted until the engaging roller 653 is engaged with the pallet P, and the turning of the engaging roller 653 with respect to the turntable 63 is started after the pallet P is engaged with the engaging roller 653. Thus, the pallet P can be conveyed in the pull-out direction Dd by starting a displacement of the engaging roller 653 in the pull-out direction Dd after the engaging roller 653 is precisely engaged with the pallet P with the displacement of the engaging roller 653 in the pull-out direction Dd suppressed.

Further, the engaging roller 653 is turnable about the roller turning axis A653. In such a configuration, the engaging roller 653 can be smoothly engaged with the pallet P regardless of friction generated between the engaging roller 653 and the pallet P.

Further, two turning hooks 65A, 65B are mounted on the turntable 63. The engagement switching mechanism 8 is provided which switches the state where the engaging roller 653 of one turning hook 65A, out of the two turning hooks 65A, 65B, is selectively engaged with the pallet P and the state where the engaging roller 653 of the other turning hook 65B is selectively engaged with the pallet P. By conveying the pallet P using the respective engaging rollers 653 of the two turning hooks 65A, 65B in this way, a long conveyance distance of the pallet P can be secured.

Further, the engagement switching mechanism 8 retracts the other turning hook 65B below the conveyance path of the pallet P with the engaging roller 653 of one turning hook 65A engaged with the pallet P, and retracts the one turning hook 65A below the conveyance path of the pallet P with the engaging roller 653 of the other turning hook 65B engaged with the pallet P. In such a configuration, the turning hook 65 not used to convey the pallet can be prevented from hindering the conveyance of the pallet P.

Further, in the engagement switching mechanism 8, the swing bar 84 is swingably supported between the both ends of the swing bar 84 by the supporter 83, the one turning hook 65A is mounted on one end part of the swing bar 84 and the other turning hook 65B is mounted on the other end part of the swing bar 84. The engagement switching mechanism 8 switches the turning hook 65 to be engaged with the pallet P between the one turning hook 65A and the other turning hook 65B by swinging the swing bar 84. In such a configuration, the turning hook 65 to be engaged with the pallet P can be switched by a simple operation of swinging the swing bar 84.

Further, the pallet conveying apparatus 6 conveys the pallet P from the pull-out start position Ld to the component supply position Ls by one motion of turning the turntable 63 in the turning direction Db after turning the turntable 63 in the turning direction Da as shown in FIGS. 6A and 6G. Specifically, the engaging roller 653 of the one turning hook 65A is engaged with the engaging projection Pe of the pallet P stored in the pallet exchanger 51 while being located upstream of the engaging roller 653 of the other turning hook 65B in the pull-out direction Dd (FIG. 6A). Subsequently, the turntable 63 is turned about the table turning axis A63 in the turning direction Da until the engaging roller 653 of the one turning hook 65A moves at least to a side downstream of the engaging roller 653 of the other turning hook 65B in the pull-out direction Dd (FIGS. 6B to 6D). In this way, the pallet P engaged with the engaging roller 653 of the one turning hook 65A is pulled in the pull-out direction Da and conveyed to the relay position Lm while the engaging roller 653 of the other turning hook 65B is located on a side upstream of the outer wall Phb of the pallet P located at the relay position Lm in the pull-out direction Dd (field "α=150°" of FIG. 6D). Then, if the engaging roller 653 of the other turning hook 65B is engaged with the outer wall Phb of the pallet P conveyed to the relay position Lm (field "ct =150° " of FIG. 6E), the turntable 63 is turned about the table turning axis A63 in the turning direction Db opposite to the turning direction Da (FIGS. 6E to 6G). In this way, the pallet P engaged with the engaging roller 653 of the other turning hook 65B is pushed in the pull-out direction Dd and conveyed to the component supply position Ls. In such a configuration, the pallet P can be pushed from the relay position Lm to the component supply position Ls by the other turning hook 65B after being pulled out from the pallet exchanger 51 to the relay position Lm by the one turning hook 65A. In this way, a long conveyance distance of the pallet P can be secured and the pallet P can be conveyed to the component supply position Ls provided in proximity to the board B.

Further, the passage path of the one turning hook 65A and the passage path of the other turning hook 65B do not overlap through the operation of FIGS. 6A to 6B in a plan view from a direction parallel to the table turning axis A63. Thus, the pallet P can be smoothly conveyed while the collision of the one and the other turning hooks 65A, 65B is prevented.

Further, the hook turning axis A65 of the one turning hook 65A and the hook turning axis A65 of the other turning hook 65B are point-symmetrically provided with respect to the table turning axis A63 in the plan view from the direction parallel to the table turning axis A63. In this way, a long conveyance distance of the pallet P can be secured.

As just described, in this embodiment, the component mounter 1 corresponds to an example of a "component mounter" of the disclosure, the pallet exchanger 51 corresponds to an example of a "pallet storage" of the disclosure, the pallet P corresponds to an example of a "pallet" of the disclosure, the mounting head 31 corresponds to an example of a "mounting head" of the disclosure, the pallet conveying apparatus 6 corresponds to an example of a "pallet conveying apparatus" of the disclosure, the bottom plate 611 corresponds to an example of a "base" of the disclosure, the turntable 63 corresponds to an example of a "main rotary body" of the disclosure, the table turning axis A63 corresponds to an example of a "main turning axis", the table driving mechanism 67 corresponds to an example of a "driver" of the disclosure, the turning hook 65 corresponds to an example of an "auxiliary rotary body" of the disclosure, the turning hook 65A corresponds to an example of "one auxiliary rotary body" of the disclosure, the turning hook 65B corresponds to an example of "other auxiliary rotary body" of the disclosure, the hook turning axis A65 corresponds to an example of an "auxiliary turning axis" of the disclosure, the turning transmission mechanism 7 corresponds to an example of a "turning transmission mechanism" of the disclosure, the engaging roller 653 corresponds to examples of an "engaging member" and a "roller" of the disclosure, the roller turning axis A653 corresponds to an example of a "roller axis" of the disclosure, the arm 652 corresponds to an example of an "arm" of the disclosure, the engagement switching mechanism 8 corresponds to an example of an "engagement switcher" of the disclosure, the component supply position Ls corresponds to an example of a "component supply position" of the disclosure, the relay position Lm corresponds to an example of a "relay position" of the disclosure, the Y direction corresponds to an example of a "conveying direction" of the disclosure, the pull-out direction Dd corresponds to an example of a "pull-out direction" of the disclosure, the engaging projection Pe mounted on the outer wall Phf corresponds to an example of a "front engagement part" of the disclosure, the outer wall Phb corresponds to an example of a "rear engagement part" of the disclosure, the turning direction Da corresponds to an example of a "first direction" of the disclosure, and the turning direction Db corresponds to an example of a "second direction" of the disclosure.

Note that the disclosure is not limited to the above embodiment and various changes can be made to the aforementioned configuration without departing from the gist thereof. For example, the shape of the turntable 63 may be any shape without being limited to a disk shape.

Further, the positional relationship of the two turning hooks 65 on the turntable 63 is not limited to the above point-symmetrical positional relationship, and these turning hooks 65 may be arranged in a different positional relationship.

Further, the number of the turning hooks 65 is not limited to two and may be one, three or more. Furthermore, the shapes of the turning hooks 65 can be changed as appropriate and the turning hooks 65 may have a circular shape.

Further, the specific configuration of the engaging member provided in the turning hook 65 may be a projection or the like having no freedom of rotation without being limited to the engaging roller 653.

Further, the mechanism for transmitting power using gears can be changed to a mechanism for transmitting power using pulleys, and the mechanism for transmitting power using pulleys can be changed to a mechanism for transmitting power using gears.

Further, the ratio (speed increasing ratio) of the angular velocity of the turning hooks 65 to that of the turntable 63 may be, for example, 1.9 to 2.1-fold or a value outside this range without being limited to 2-fold.

Further, the mechanism for lifting the turning hook 65 between the engaged position He and the separated position Hd is not limited to a mechanism using a seesaw as in the above engagement switching mechanism 8. Accordingly, the turning hook 65 may be mounted on a rod of an actuator for moving the rod back and forth in the Z direction, and moved up and down by this actuator.

Further, the pallet P can be pulled back to the pull-out start position Ld in the pallet exchanger 51 from the component supply position Ls by reversely performing the operation of FIGS. 6A to 6G.

What is claimed is:

1. A pallet conveying apparatus, comprising:
    a base;
    a main rotary body mounted on the base turnably about a main turning axis;
    a driver configured to turn the main rotary body about the main turning axis with respect to the base;
    an auxiliary rotary body mounted on the main rotary body turnably about an auxiliary turning axis parallel to the main turning axis and separated from the main turning axis, the auxiliary rotary body including an engaging member engageable with a pallet having components placed thereon at a position separated from the auxiliary turning axis; and
    a turning transmitter configured to turn the auxiliary rotary body with respect to the main rotary body in a direction opposite to a turning direction of the main rotary body by transmitting the turning of the main turning body with respect to the base to the auxiliary rotary body,
    wherein:
    if the main rotary body turns about the main turning axis, the auxiliary rotary body displaces the engaging member in a conveying direction orthogonal to the main turning axis to convey the pallet engaged with the engaging member in the conveying direction by turning about the auxiliary turning axis with respect to the main rotary body in the direction opposite to the turning direction of the main rotary body while turning about the main turning axis with respect to the base together with the main rotary body.

2. The pallet conveying apparatus according to claim 1, wherein the turning transmitter is configured to turn the auxiliary rotary body about the auxiliary turning axis with respect to the main rotary body at an angle twice the turning angle of the main rotary body about the main turning axis with respect to the base.

3. The pallet conveying apparatus according to claim 1 which pulls out the pallet from a pallet storage storing the pallet, wherein:
    the engaging member of the auxiliary rotary body moves to a position to be engaged with the pallet stored in the pallet storage by turning about the main turning axis with respect to the base together with the main rotary body from a state separated from the pallet stored in the pallet storage, and
    the turning transmitter restricts the turning of the auxiliary rotary body with respect to the main rotary body by cutting off the transmission of the turning of the main rotary body with respect to the base to the auxiliary rotary body until the engaging member is engaged with the pallet stored in the pallet storage, and starts the transmission of the turning of the main rotary body with respect to the base to the auxiliary rotary body to turn the auxiliary rotary body with respect to the main rotary body if the engaging member is engaged with the pallet stored in the pallet storage.

4. The pallet conveying apparatus according claim 1, wherein the engaging member is a roller turnable about a roller axis parallel to the main turning axis.

5. The pallet conveying apparatus according to claim 1, wherein, wherein the auxiliary rotary body includes an arm configured to turn about the auxiliary turning axis and the engaging member is provided on an end part of the arm opposite to the auxiliary turning axis.

6. The pallet conveying apparatus according to claim 1, wherein:
    two auxiliary rotary bodies are mounted on the main rotary body; and
    the pallet conveying apparatus further comprises an engagement switcher configured to switch a state where the engaging member of one auxiliary rotary body of the two auxiliary rotary bodies is selectively engaged with the pallet and a state where the engaging member of other auxiliary rotary body is selectively engaged with the pallet.

7. The pallet conveying apparatus according to claim 6, wherein the engagement switcher retracts the other auxiliary rotary body from a conveyance path of the pallet in a state where the engaging member of the one auxiliary rotary body is engaged with the pallet and retracts the one auxiliary rotary body from the conveyance path in a state where the engaging member of the other auxiliary rotary body is engaged with the pallet.

8. The pallet conveying apparatus according to claim 6, wherein the engagement switcher includes a swing member with one end part having the one auxiliary rotary body mounted thereon and other end part having the other auxiliary rotary body mounted thereon and a support member configured to swingably supports the swing member between the one end part and the other end part, and switch the auxiliary rotary body to be engaged with the pallet between the one auxiliary rotary body and the other auxiliary rotary body by swinging the swing member.

9. The pallet conveying apparatus according to claim 6 which pulls out the pallet in a pull-out direction parallel to the conveying direction from a pallet storage storing the pallet toward a component supply position by way of a relay position, wherein:
the pallet includes a front engagement part and a rear engagement part provided upstream of the front engagement part in the pull-out direction,
the pallet conveying apparatus successively performs:
an operation of engaging the engaging member of the one auxiliary rotary body with the front engagement part of the pallet stored in the pallet storage in a state where the engaging member of the one auxiliary rotary body is located upstream of the engaging member of the other auxiliary rotary body in the pull-out direction;
an operation of pulling the pallet engaged with the engaging member of the one auxiliary rotary body in the pull-out direction to convey the pallet to the relay position and locating the engaging member of the other auxiliary rotary body upstream of the rear engagement part of the pallet located at the relay position in the pull-out direction by turning the main rotary body about the main turning axis in a first direction until the engaging member of the one auxiliary rotary body moves at least to a side downstream of the engaging member of the other auxiliary rotary body in the pull-out direction;
an operation of engaging the engaging member of the other auxiliary rotary body with the rear engagement part of the pallet conveyed to the relay position; and
an operation of pushing the pallet engaged with the engaging member of the other auxiliary rotary body in the pull-out direction to convey the pallet to the component supply position by turning the main rotary body about the main turning axis in a second direction opposite to the first direction.

10. The pallet conveying apparatus according to claim 9, wherein a passage path of the one auxiliary rotary body and a passage path of the other auxiliary rotary body do not overlap through each operation in a plan view from a direction parallel to the main turning axis.

11. The pallet conveying apparatus according to claim 6, wherein the auxiliary turning axis of the one auxiliary rotary body and the auxiliary turning axis of the other auxiliary rotary body are point-symmetrically arranged with respect to the main rotary axis in a plan view from a direction parallel to the main turning axis.

12. A component mounter, comprising:
a pallet storage configured to store a pallet having components placed thereon;
the pallet conveying apparatus according to claim 1; and
a mounting head configured to mount the component placed on the pallet conveyed from the pallet storage to a component supply position by the pallet conveying apparatus on a board.

13. The pallet conveying apparatus according to claim 2 which pulls out the pallet from a pallet storage storing the pallet, wherein:
the engaging member of the auxiliary rotary body moves to a position to be engaged with the pallet stored in the pallet storage by turning about the main turning axis with respect to the base together with the main rotary body from a state separated from the pallet stored in the pallet storage, and
the turning transmitter restricts the turning of the auxiliary rotary body with respect to the main rotary body by cutting off the transmission of the turning of the main rotary body with respect to the base to the auxiliary rotary body until the engaging member is engaged with the pallet stored in the pallet storage, and starts the transmission of the turning of the main rotary body with respect to the base to the auxiliary rotary body to turn the auxiliary rotary body with respect to the main rotary body if the engaging member is engaged with the pallet stored in the pallet storage.

14. The pallet conveying apparatus according claim 2, wherein the engaging member is a roller turnable about a roller axis parallel to the main turning axis.

15. The pallet conveying apparatus according to claim 2, wherein the auxiliary rotary body includes an arm configured to turn about the auxiliary turning axis and the engaging member is provided on an end part of the arm opposite to the auxiliary turning axis.

16. The pallet conveying apparatus according to claim 2, wherein:
two auxiliary rotary bodies are mounted on the main rotary body; and
the pallet conveying apparatus further comprises an engagement switcher configured to switch a state where the engaging member of one auxiliary rotary body of the two auxiliary rotary bodies is selectively engaged with the pallet and a state where the engaging member of other auxiliary rotary body is selectively engaged with the pallet.

17. The pallet conveying apparatus according to claim 7, wherein the engagement switcher includes a swing member with one end part having the one auxiliary rotary body mounted thereon and other end part having the other auxiliary rotary body mounted thereon and a support member configured to swingably supports the swing member between the one end part and the other end part, and switch the auxiliary rotary body to be engaged with the pallet between the one auxiliary rotary body and the other auxiliary rotary body by swinging the swing member.

18. The pallet conveying apparatus according to claim 7 which pulls out the pallet in a pull-out direction parallel to the conveying direction from a pallet storage storing the pallet toward a component supply position by way of a relay position, wherein:
the pallet includes a front engagement part and a rear engagement part provided upstream of the front engagement part in the pull-out direction,
the pallet conveying apparatus successively performs:
an operation of engaging the engaging member of the one auxiliary rotary body with the front engagement part of the pallet stored in the pallet storage in a state where the engaging member of the one auxiliary rotary body is located upstream of the engaging member of the other auxiliary rotary body in the pull-out direction;
an operation of pulling the pallet engaged with the engaging member of the one auxiliary rotary body in the pull-out direction to convey the pallet to the relay position and locating the engaging member of the other auxiliary rotary body upstream of the rear engagement part of the pallet located at the relay position in the pull-out direction by turning the main rotary body about the main turning axis in a first direction until the engaging member of the one auxiliary rotary body moves at least to a side downstream of the engaging member of the other auxiliary rotary body in the pull-out direction;

an operation of engaging the engaging member of the other auxiliary rotary body with the rear engagement part of the pallet conveyed to the relay position; and an operation of pushing the pallet engaged with the engaging member of the other auxiliary rotary body in the pull-out direction to convey the pallet to the component supply position by turning the main rotary body about the main turning axis in a second direction opposite to the first direction.

19. The pallet conveying apparatus according to claim 7, wherein the auxiliary turning axis of the one auxiliary rotary body and the auxiliary turning axis of the other auxiliary rotary body are point-symmetrically arranged with respect to the main rotary axis in a plan view from a direction parallel to the main turning axis.

20. A pallet conveying method, comprising:

engaging an engaging member of an auxiliary rotary body turnably mounted on a main rotary body about an auxiliary turning axis with a pallet having components placed thereon, the auxiliary turning axis being parallel to a main turning axis of the main rotary body and separated from the main turning axis; and turning the auxiliary rotary body with respect to the main rotary body in a direction opposite to a turning direction of the main rotary body by turning the main rotary body about the main turning axis and transmitting the turning of the main rotary body to the auxiliary rotary body, wherein:

the engaging member of the auxiliary rotary body is provided at a position separated from the auxiliary turning axis, and if the main rotary body turns about the main turning axis, the auxiliary rotary body displaces the engaging member in a conveying direction orthogonal to the main turning axis to convey the pallet engaged with the engaging member in the conveying direction by turning about the auxiliary turning axis with respect to the main rotary body in the direction opposite to the turning direction of the main rotary body while turning about the main turning axis together with the main rotary body.

\* \* \* \* \*